(12) United States Patent
Sul et al.

(10) Patent No.: US 7,984,369 B2
(45) Date of Patent: Jul. 19, 2011

(54) CONCURRENT CODE CHECKER AND HARDWARE EFFICIENT HIGH-SPEED I/O HAVING BUILT-IN SELF-TEST AND DEBUG FEATURES

(75) Inventors: Chinsong Sul, Mountain View, CA (US); Hoon Choi, Mountain View, CA (US); Gijung Ahn, San Jose, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 1173 days.

(21) Appl. No.: 11/656,331

(22) Filed: Jan. 19, 2007

(65) Prior Publication Data

US 2007/0204204 A1 Aug. 30, 2007

Related U.S. Application Data

(60) Provisional application No. 60/760,601, filed on Jan. 20, 2006.

(51) Int. Cl.
*G06F 11/00* (2006.01)
*H03M 13/00* (2006.01)
*H04L 1/00* (2006.01)

(52) U.S. Cl. ........................................ 714/809; 714/811
(58) Field of Classification Search .................. 714/809, 714/811
See application file for complete search history.

(56) References Cited

U.S. PATENT DOCUMENTS

| | | | | |
|---|---|---|---|---|
| 4,486,739 A * | 12/1984 | Franaszek et al. | ............. | 341/59 |
| 5,025,256 A * | 6/1991 | Stevens | ............. | 341/59 |
| 5,387,911 A * | 2/1995 | Gleichert et al. | ............. | 341/95 |
| 5,841,790 A * | 11/1998 | Salem et al. | ............. | 714/724 |
| 5,907,566 A * | 5/1999 | Benson et al. | ............. | 714/798 |
| 5,978,946 A * | 11/1999 | Needham | ............. | 714/732 |
| 6,198,413 B1 * | 3/2001 | Widmer | ............. | 341/59 |
| 6,286,121 B1 * | 9/2001 | Osawa et al. | ............. | 714/738 |
| 6,614,369 B1 * | 9/2003 | Widmer | ............. | 341/59 |
| 6,747,580 B1 * | 6/2004 | Schmidt | ............. | 341/50 |
| 6,807,646 B1 * | 10/2004 | Williams et al. | ............. | 714/736 |
| 7,111,220 B1 * | 9/2006 | Sasaki et al. | ............. | 714/753 |
| 7,290,202 B2 * | 10/2007 | Kang et al. | ............. | 714/799 |
| 7,451,362 B2 * | 11/2008 | Chen et al. | ............. | 714/704 |
| 2004/0083419 A1 * | 4/2004 | Chiba et al. | ............. | 714/799 |

FOREIGN PATENT DOCUMENTS

JP 06 343069 12/1994

OTHER PUBLICATIONS

U.S. Appl. No. 11/476,457, filed Jun. 27, 2006, Sul, Chinsong.

(Continued)

*Primary Examiner* — Joseph D Torres
(74) *Attorney, Agent, or Firm* — Perkins Coie LLP

(57) ABSTRACT

Method, device, and system for testing for errors in high-speed input/output systems. System and device may include a concurrent code checker for checking for errors in encoded data packets through data packets static properties and dynamic properties of the data stream including the packets. Method may involve detecting invalid encoded packets using the data packets static properties and the dynamic properties of the data stream including the packets. Method for optimizing a design of a concurrent code checker logic using don't-care conditions, and concurrent code checker circuit having reduce logic element and semiconductor area requirements.

56 Claims, 17 Drawing Sheets

OTHER PUBLICATIONS

Widmer et al., IBM J. Res. Develop., 27(5):440-451 (1983).
Mitra et al., *Proceedings International Test Conference, IEEE*, 985-994 (2000).
Digital Systems Testing and Testable Design, M. Abramovici, M. Breuer, A. Friedman, Wiley-IEEE Press, Section 10.6.3, p. 445-447 (1994).
Mitra et al., *VLSI Test Symposium, 2000 Proceedings 18$^{th}$ IEEE Montreal*, 453-458 (2000).
European Patent Application No. 07250229.7-2206/1814234 Summon to Oral Proceedings mailed Mar. 31, 2010.

\* cited by examiner

| 8-bit data | RD− | RD+ |
|---|---|---|
| $d_0 d_1 d_2 d_3 d_4 d_5 d_6 d_7$ | $e_0 e_1 e_2 e_3 e_4 e_5 e_6 e_7 e_8 e_9$ | $e_0 e_1 e_2 e_3 e_4 e_5 e_6 e_7 e_8 e_9$ |
| 10101011<br>11010100<br>- - -<br>11010110 | 1010101100<br>1101010010<br>- - -<br>1101011001 | 1010101100<br>0010101101<br>- - -<br>0010100110 |

Fig. 3

1. Program CEC_en and DC/RD;
2. Deserialize data packet;
3. Check validity of data packet, if enabled;
    1. If invalid, report error and go to 2;
4. Derive DC or RD value
    1. If invalid, report error;
5. Go to 2 until done

|  | 1602 | | | |
|---|---|---|---|---|
| 1604 1606 1608 | 1610 | 1612 | 1614 | |
| Code [9:0] | DC | invalCW | RDT | |
| RD₋₂ : 4160 (117) | -2 | 0 | X | 1621 |
| RD₋₀ : 5051 (67) | 0 | 0 | 1 | 1622 |
| RD₀ : 5051 (74) | 0 | 0 | 0 | 1623 |
| Invalid 5051 (44) | X | 1 | X | 1624 |
| RD₊₀ : 5051 (67) | 0 | 0 | -1 | 1625 |
| RD₊₂ : 4160 (117) | 2 | 0 | X | 1626 |
| Invalid 4X6X' (186) | X | 1 | X | 1627 |
| Invalid (352) | X | 1 | X | 1628 |

FIG. 16

CONCURRENT CODE CHECKER AND HARDWARE EFFICIENT HIGH-SPEED I/O HAVING BUILT-IN SELF-TEST AND DEBUG FEATURES

CROSS-REFERENCE TO RELATED APPLICATIONS

This Application claims the benefit under 35 U.S.C. §119 of U.S. Provisional Application No. 60/760,601 entitled Concurrent Code Checker filed on Jan. 20, 2006 by Chinsong Sul, Hoon Choi and Gijung Ahn; which application is incorporated by reference.

This Application also claims the benefit under 35 U.S.C. §120 to U.S. Utility patent application Ser. No. 11/476,457 entitled Test Clock Control Structures to Generate Configurable Test Clocks for Scan-based Testing of Electronic Circuits using Programmable Test Clock Controllers filed on 27 Jun. 2006 in the name of inventor Chinsong Sul, which application is incorporated by reference.

FIELD OF THE INVENTION

This invention relates generally to systems, devices, and methods for testing for high speed data transmission errors and more particularly to systems, devices, and methods for checking a data stream for errors using a concurrent code checker and to an optimized concurrent code checker logic circuit.

BACKGROUND

The foregoing examples of the related art and limitations related therewith are intended to be illustrative and not exclusive. Other limitations of the related art will become apparent to those of skill in the art upon a reading of the specification and a study of the drawings.

Most common built-in tests for High Speed Input/Output (HSIO) employ two identical Pseudo-Random Binary Sequence (PRBS) generators, one located in a transmitter (TX) and the other in a receiver (RX). Both PRBS must be synchronized, allowing the RX to replicate exactly what the TX generates. The RX compares received data transmissions with what was expected and if differences between received data transmissions and the transmissions that were generated in the test data set identifies failures. The test patterns generated or checked by PRBS are limited by the employed LFSR polynomial. The LFSR used in PRBS can usually supply a single sequence of pseudo-random patterns. If additional patterns were required, they can be implemented by adding extra hardware.

Many High-Speed Input/Output (HSIO) systems also encode data for transmission, for example using a 10-bit DC-balanced clock-embedded encoding scheme. The IBM 8B/10B encoding scheme is an example of such a scheme and encodes 8-bit values into 10-bit codewords. Each 8-bit value has two assigned codewords allowing the number of 1's and 0's in a data stream to be balanced. When the number of 1's and 0's are the same or substantially the same over some specified number of codewords the signal levels DC-voltage level balanced over that specified number of codewords. The difference between the number of 1's and 0's can be defined as disparity or DC value. DC-balancing is to reduce inter-symbol interference (ISI) problem and to make the AC coupling more applicable. If, for example, number of 1's or 0's in the sequence of codeword is biased to 1 (or 0), it is difficult to transmit a 0 (or 1) symbol because it requires a lot more energy to overcome the biased state of the channel. The transmitted opposite state symbol may therefore be recovered in error. If, say, three consecutive codewords (0000000000, 0000000010, 0000000000) were transmitted over the channel, the symbol may be lost due to ISI problem. Many High-Speed I/O (HSIO) systems uses AC coupling that uses a capacitor between the transmitter and the receiver to block a low frequency voltage noise coming from power supply and ground. Low frequency data streams, such as for example shown above, may be blocked and may result in the receiving signal voltage distortion and error. To keep the receiving data error within the specified target, the maximum allowed disparity of a codeword is specified at the transmission. The maximum disparity allowed in the transmission codewords is defined as DC-balance. The IBM 8B/10B coding scheme is know in the art and described in the paper by A. X. Widmer and P. A. Franaszek, entitled "A DC-Balance, Partitioned-Block, 8B/10B Transmission Code", IBM J. Res. Develop., Vol. 27, No. 5, PP. 440-451, September 1983; which paper is hereby incorporated by reference.

One disadvantage of conventional PRBS generators, systems and methods is that they often lack features for testing silicon chips, such as online and/or offline testing and/or debugging of the chip. Online and offline debugging or testing refers to tests run during field use and testing respectively. Normal mode refers to using a chip under normal usage circumstances, while test mode refers to using a chip in a test environment. Having both online and off-line may be advantageous because the quality of a communication channel can be tested and determined in the field.

An additional disadvantage of conventional PRBS systems and methods is the requirement that the TX PRBS and RX PRBS must be synchronized so that a proper comparison of know transmitted test data may be compared to the received data and any errors or failures identified. When using a TX PRBS and RX PRBS system, if a transmission error occurs causing synchronization failure during a test, the system cannot recover. The test results after such a synchronization failure may not be meaningful.

There therefore remains a need for systems and methods that overcome the problems and limitations of conventional PRBS.

SUMMARY

In one aspect, the invention provides a concurrent code checker and hardware efficient high-speed Input/Output having built-in self-test and debug features.

In another aspect, the invention provides a receiver including: a deserializer configured for deserializing incoming serialized encoded data into an encoded data packet; a code book configured to determine whether the data packet is invalid; specification logic configured to check if the data packet is invalid violating the specifications of the encoding scheme used to encode the data packet; and data packet error logic for registering a transmission error, in operation, if the encoded data packet is invalid.

In another aspect, the invention provides a method for verifying integrity of data, the method including receiving an incoming serialized encoded data packet; deserializing the incoming serialized encoded data packet; checking data packet is valid; deriving a DC (or RD) value of the encoded data packet; determining whether the DC (or RD) value is a valid or an invalid DC (or RD) value; and if the DC (or RD) value is invalid, then flagging the incoming deserialized encoded data packet as failed.

In still another aspect, the invention provides error detection circuitry comprising: a concurrent code checker (C3) logic configured to determine a DC value of an encoded data packet in a data stream; and a finite state machine (FSM) configured to track the state of the data stream; wherein, in operation, the C3 logic sends the DC value of the encoded data packet to the FSM which uses the DC value to determine if an error has occurred given the current state of the data stream.

In yet another embodiment, the invention provides a computer program stored on a computer readable media and including instructions for controlling the operation of a computing device, the instructions including instructions for causing the computing device to verifying integrity of data by performing the steps of: receiving an incoming serialized encoded data packet; deserializing the incoming serialized encoded data packet; checking validity of data packet; deriving a DC (or RD) value of the encoded data packet; determining whether the DC (or RD) value is a valid or an invalid DC (or RD) value; if the deserialized encoded data packet does not have a valid DC (or RD) value, and then flagging the incoming deserialized encoded data packet as failed. These DC and/or RD values may be referred to generically as a test response as both the DC value and RD value are exemplary test responses.

In still another embodiment, the invention provides a method for testing a capability of a concurrent code checker (C3) logic with a data stream in a system, the method comprising: programming at least one register in the concurrent code checker (C3) logic to configure the system into a testing mode; monitoring codewords and determining a number of valid codewords detected; if a predetermined number of valid codewords are detected, the test control circuitry in the CDD enabling a running disparity finite state machine (RD FSM) to check validity of a data stream; when the RD FSM is enabled, using the RE FSM to monitor the data stream and to properly synchronize to the data stream; after synchronization, the C3 continuously tracking the test specification until done; and when testing is completed, disabling the C3 logic.

In yet another embodiment, the invention provides a method of optimizing a hardware circuit design to reduce the number of logic elements for implementing a concurrent code checker by identifying and specifying more don't-care conditions in a logic truth table definition. In still another aspect, the invention provides a circuit and device having reduced logic circuit elements and smaller area when implemented as a semiconductor device.

These and other aspects of the invention will be apparent in light of the accompanying description and drawings.

BRIEF DESCRIPTION OF THE DRAWINGS

Embodiments of the inventions are illustrated in the figures. However, the embodiments and figures are illustrative rather than limiting; they provide examples of the invention.

FIG. 3 depicts a sample representation of internal values in an exemplary embodiment of a codebook.

FIG. 16 depicts an exemplary table associated with a design optimization that uses don't car signal conditions to reduce the logic and semiconductor area in a concurrent code checker circuit.

DETAILED DESCRIPTION OF EXEMPLARY EMBODIMENTS

Figure 1:
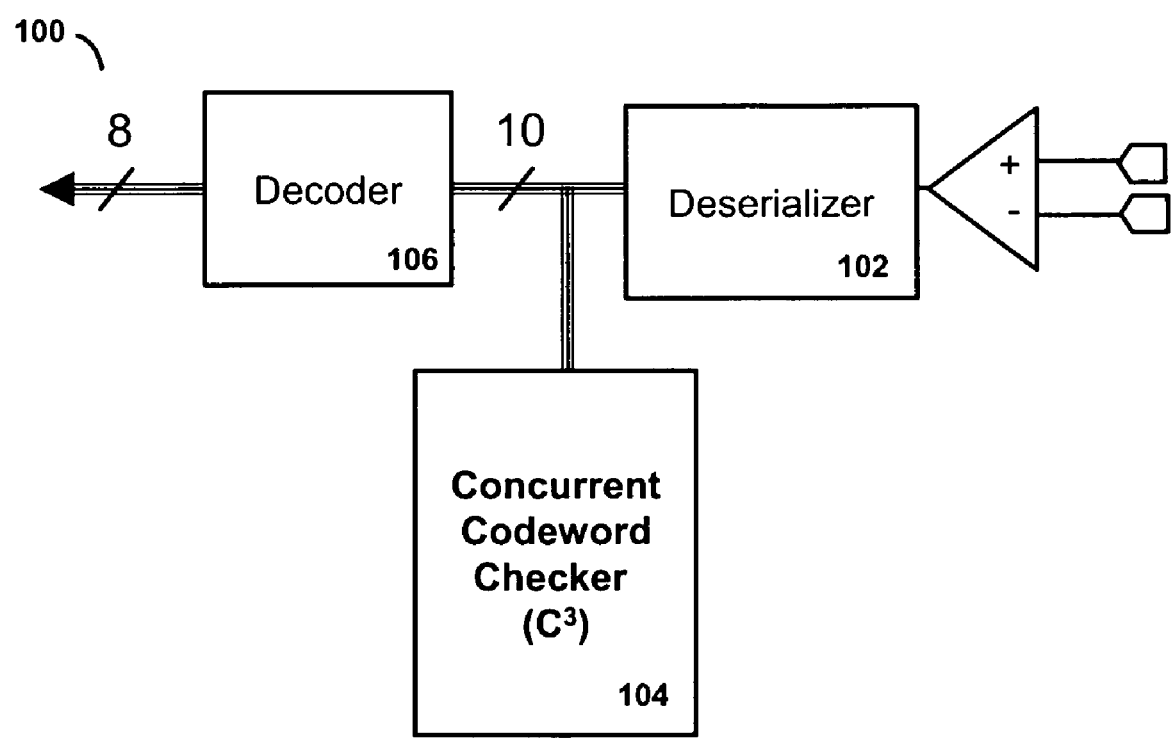
FIG. 1 depicts an exemplary embodiment of a High-Speed Input/Output (HSIO) device configured to check encoded data for transmission errors.

In the following description, several specific embodiments of the invention are described in detail to provide a thorough understanding of different aspects of the invention. One skilled in the relevant art will recognize in light of the description provided here, however, that the invention can be practiced without one or more of the specific details or features, or in combination with other components, or the like. In other instances, well-known implementations, operations, or circuit elements are not shown or described in detail to avoid obscuring aspects of various embodiments, of the invention.

An exemplary embodiment comprises a high speed I/O system. Data transmissions are serialized and sent to the receiver in encoded data packets. The receiver deserializes data packets and uses a concurrent code checker including a codebook of logical equations and DC/RD specifications to check the encoded packets and data stream for invalidity. In some exemplary embodiments, static properties of the encoded data packet and dynamic properties of the data stream are used. In some exemplary embodiments dynamic properties can be tracked using a finite-state-machine.

Integrated circuits (ICs) are continuously under cost and size pressures. High Speed Input/Output (HSIO) devices can be particularly problematic because testing HSIO devices can be more difficult and require specialized high-end automated test equipment (ATE).

In at least some embodiments, the inventive testing is performed in an online test mode. Online test is advantageously performed while the system is running in a normal functional mode. It is usually run at field with other components of the system operating at the same time so that the testing is done in a more nearly normal functional mode environment. It may be appreciated that conventional PRBS Built-In Self-Test (BIST) cannot perform online testing. A conventional PRBS BIST can only be enabled during the test and not during functional mode. One of advantages is that one can measure channel quality by measuring BER at field. This BER measurement at field may be more practical than the one measured at test because operating condition of test may be at least somewhat different than the operating condition of actual applications. That is, a test may possibly not be able to mimic exactly the same functionality of a device or system under test for all of a variety of applications. The BER measurement at field may be a more accurate measurement for channel quality of application under consideration, or at least provide a level of confidence that the testing has been performed under as nearly identical conditions as possible.

The proposed system, method and device provide, among other advantages, improved Integrated Circuit (IC) production and reduced testing costs for HSIO devices. This can be accomplished in an efficient and robust manner compared to other ways. Advantageously, the proposed system, method and device checks the validity of an encoded data stream. These and other advantages of the present invention will become apparent to those skilled in the art upon a reading of the accompanying detailed description, including the several figures of the drawings.

FIG. 1 depicts an example High-Speed Input/Output or I/O (HSIO) device configured to check encoded data for transmission errors. In general, the errors may have occurred, if at all, on the transmit (TX) side, during transmission, or on the receive (RX) side, or combination of places. In one non-limiting embodiment, the receiver 100 includes a deserializer 102, a concurrent code checker (C3) 104, and a decoder 106. In some non-limiting exemplary embodiments, a HSIO device such as for example as illustrated in FIG. 1, may optionally but advantageously be implemented on the same chip to provide built-in test capability to a device under test (DUT).

The deserializer 102 is configured to receive serialized and encoded high speed data transmissions. The deserializer is coupled with the decoder 106 and the C3 104. The deserializer 102 is configured to deserialize received serial data packet(s) and forward the resulting deserialized data to the decoder 106 and the C3 104. The manner of coupling between the deserializer 102 and decoder 106, and the deserializer 102 and C3 104 may be accomplished in any manner known or convenient. For example, a deserializer and a decoder may be coupled using a data bus system.

The decoder 106 is configured to decoded encoded data packets received from the coupled deserializer 102. The decoder 106 may send decoded data to any device and/or system known or convenient. The encoded data packets may be encoded in any manner known or convenient.

In some exemplary embodiments encoded data packets will be encoded in a manner to balance the number of 1s and 0s sent. Non-limiting examples of data packet encoding schemes which may be used with some embodiments includes, IBM 8B/10B, 5B/6B, 4B/6B as are known in the art and/or other coding or encoding schemes known or that may be developed in the future. In some exemplary embodiments transmitted data may be encoded using a 10-bit DC-balanced clock-embedded encoding scheme The concurrent code checker (C3) 204 includes a code book 212 and DC/RD specifications 214. The code book 212 may be implemented as a combinational logic circuitry or a read-only-memory (ROM) or in other ways. The DC and/or RD specifications may for example be implemented as a finite-state-machine or in other ways known or convenient. The C3 204 receives encoded data packets from the coupled deserializer 202. The encoded data packets may then be checked for validity of invalidity while still encoded, using logical equations in the code book 212 and the DC/RD specifications 214.

The logical equations in code book 212, which can be obtained by synthesizing valid codewords included in the codebook considering a codeword as an input and valid or invalid as an output, may usually be dependent on the encoding scheme used. In some exemplary embodiments, a code book will include or contain state values of different encodings. For example, in one non-limiting exemplary embodiment, a code book may include both a RD− and a RD+ encoded data value for each non-encoded data packet. A RD-encoded data value may for example be a binary data value with more 1s than 0s. Similarly, a RD+ encoded data value may be a binary data value with more 0s than 1s. In some exemplary embodiments a codebook may assign a DC value to an encoded data packet, derived from the codeword used in the encoding scheme. The DC value may be used by the code book to identify an invalid (or valid) data packet. It may be appreciated in light of the description provided here, that the normal intent is to identify invalid data so as to provide an indication of an error or failure conditions. One may alternatively identify all valid data, but this may be less efficient as identifying all valid data when there are expected to be few errors may be less efficient than identifying the anticipated few invalid data or error or failure conditions. This description therefore focuses on identifying invalid data with the understanding that the opposite convention of identifying valid data may be used.

In some exemplary embodiments a C3 may check individual encoded data packets for invalidity as well as checking for the invalidity of encoded data packets in a data stream. In some exemplary embodiments a C3 is coupled to a bit-error-rate (BER) system configured to collect the rate at which invalid data packets or invalid bits in data packets occur. In some exemplary embodiments a C3 is used in a device and/or system to detect defects which cause bit errors. The device and/or system may be configured to detect soft errors and/or hard errors.

In some exemplary embodiments a C3 operates by checking the balance of 0s and 1s in a data stream to detect invalid codewords and/or transmission errors. A C3 is able to determine if an encoded data packet is invalid because in some exemplary embodiments an encoding scheme is used which encodes data as DC-balanced codewords which have the same number of 1s and 0s. However, in some exemplary embodiments an encoding scheme is used in which the number of 1s and 0s in valid codeword will not be exactly balanced, but will be bounded to certain DC values, allowing a C3 to check a packet for validity within the bounds. The bound may be determined by the DC value of the packet, determined by evaluating the expression for the DC value of codewords $c_i$ in a packet given by $DC(c_i)=N_1-N_0$, where $N_1$ is the number of 1s and $N_0$ is the number of 0s.

In a DC specification for a non-limiting exemplary embodiment using an IBM 8B/10B encoding scheme, the DC-value of codeword $c_i$ may be $DC(c_i) \in \{-2, 0, 2\}$. Other DC values of a packet would violate the DC specification. However, not all codewords which do not violate the DC specification of an encoding scheme are necessarily valid codewords. The DC specification for many encoding schemes is a sufficient condition for invalidity, but not a necessary condition. For example, in a non-limiting example of an IBM 8B/10B encoding scheme, there are 442 valid codewords and 582 invalid, however 230 of the invalid codewords will satisfy the DC specification. If the DC spec is employed in the test to detect errors, the unused codewords that satisfy the DC spec can be used as test stimulus to increase test functionality.

In some exemplary embodiments a C3 detects errors in a data stream because the encoding scheme DC-balances a data stream of codewords. In some exemplary embodiments the DC balance of the data stream may be validated by tracking the running disparity (RD) of the data stream. The running disparity (RD) tracks whether an excess of 0s or 1s has been transmitted so far in the data stream. The surplus of 0s or 1s in the transmitted data stream is referred as the running disparity of the data stream. In some exemplary embodiments the RD is used to track whether an excess of 0s or 1s in a data stream has been transmitted to a receiver, and therefore indicating a transmission error has occurred. For example, if an excess of ones have been transmitted in a data stream the RD will be positive while an excess of zeroes creates a negative RD. When an individual data packet in a data stream is received the value of the data packet may alter the current RD of the data stream. For example, a data packet with more 1s or 0s will change the RD in a positive value direction while a balanced data packet of an equal number of 0s and 1s leaves the RD unchanged.

In some exemplary embodiments, and because a C3 may be independent of a PRBS polynomial, but is derived from underlying encoding scheme, the C3 can accommodate all valid codewords and some invalid codewords that satisfy a test spec (for example the DC or RD spec). The C3 hardware may be 50% of conventional PRBS (SIMG's experiment) and can handle larger test patterns during a test. In addition a PRBS can generate one pseudo-random pattern sequence out of many sequences that C3 can handle.

In the non-limiting example of an IBM 8B/10B encoding scheme codewords of type $C_{-2}$ and $C_{+2}$ are interleaved in the data stream $s_i$ to create a DC-balanced data stream, and is called the DC (test) specification of the data stream. Here, codewords of type $C_{-2}$ and $C_{+2}$ refer to codewords with two more 0s than 1s and two more 1s than 0s respectively. The IBM 8B/10B encoding scheme is bounded, requiring an equal number of 1s and 0s, two more 0s than 1s, or two more 1s than 0s in any valid codeword. In the IBM 8B/10B example, each possible 8-bit value to be transmitted may have two possible 10-bit codewords assigned, both a positive 10-bit codeword value (equal or more 1s than 0s) and a negative 10-bit codeword value (equal or more 0s than 1s). An IBM 8B/10B encoding scheme does not require a DC of a data stream to be exactly balanced at a given time but bounds the DC value.

In some exemplary embodiments the value of the running disparity (RD) is tracked by a concurrent code checker (C3). The C3 may track the data stream of encoded packets by modeling the data as a finite state machine, allowing the data stream to be there are two valid RD states, negative running disparity or "RD−", and positive running disparity or "RD+". Because each 8-bit value encoded in the IBM 8B/10B encoding scheme has two possible 10-bit codewords, the data stream can be maintained as substantially DC-balanced, and therefore an invalid RD value indicates an error which can be detected by a C3. For example, in an IBM 8B/10B encoding scheme if two codewords of negative $C_{-2}$ type were transmitted without interleaving them with the positive $C_{+2}$ type, the transmitted data stream would have impermissibly more 0s than 1s would violate the encoding scheme.

In some exemplary embodiments, an odd number of bit errors in a codeword will change the value of the codeword into an invalid codeword. The bit change can be detected through a code error checker (CEC), through the DC value of the particular codeword or through the RD value of the data stream. In some exemplary embodiments an even number of bit errors can be detected by the changes in the DC value of the data stream and in long streams of codewords. The chance of undetectable errors repeatedly often without interleaving detectable errors is relatively low. In some exemplary embodiments the detection of errors is based on the assumption that the source generates valid codeword stream with respect to the test spec under consideration. In some exemplary embodiments, the test spec will be the RD spec or the DC spec. In some embodiments, the test spec may be the RD spec and the DC spec or some other combination of the two. Analogously, "test response" may be used as generic name for DC values, RD values, and other responses or conditions such as "invalid" and RD type.

The code book 112 may generally be implemented by synthesizing the valid codewords into logical equations which may be applied to encoded data packets to check the data packet for invalidity. In some exemplary embodiments the logical equations will depend on the encoding scheme used. In some exemplary embodiments a 10-bit DC-balanced clock-embedded encoding scheme may be used. In a non-limiting example using the IBM 8B/10B encoding scheme, the code book can check for data stream invalidity and/or transmission errors using a set of eleven logical equations. One exemplary set of these eleven equations are described in the A. X. Widmer and P. A. Franaszek reference ("A DC-Balance, Partitioned-Block, 8B/10B Transmission code", IBM J. Res. Develop., Vol. 27, No. 5, PP. 440-451, September 1983) incorporated by reference herein, and set forth below. It will be appreciated that the invention is not limited only to this particular code set, even though this code set has particular applicability here. Furthermore, it will be appreciated that neither the invention nor particular embodiments of the invention are limited to either eleven equations or to this particular set or formulation of the equations and that the equations may be recast into an equivalent mathematical and/or logical set and be used or implemented in such modified form. On the other hand, at least one embodiment of the invention may advantageously use the exemplary eleven equations for use with the 8B/10B in the same form set forth here.

In the exemplary embodiment an invalid codeword results when any of the following equations are true. Where for an 10-bit codeword, bit 9=j, bit 8=h, bit 7=g, bit 6=f. bit 5=l, bit 4=e, bit 3=d, bit 2=c, bit 1=b, bit 0=a. P13 indicates that 3 or the 4 bits abcd are '0' and the other is '1', i.e., 0001.P31 indicates that 3 of the 4 bits abcd are '1' and the other is '0', i.e., 1110. Table 1 shows exemplary equations for use in the IBM 8B/10B encoding scheme.

The exemplary equations shown in Table 1 are used to implement the IBM 8/10 codebook. The equations may be implemented in network of logic gates forming a code error checker (CEC) circuit block. The CEC circuit accepts 10-bit codeword as an input and determines whether the codeword is included in the codebook. If the codeword under consideration is not in the codebook, the CEC circuit flags invalid (invalCW=1) indicating that the codeword is invalid codeword.

It may be appreciated in light of the description provided herein that different numbers and/or sets of equations may be used with different coding schemes, such as for example with the IBM 5B/6B, 4B/6B or other coding schemes.

TABLE 1

Exemplary IBM 8B/10B Equations

| Equation Number | Equation Value |
| --- | --- |
| 1 | a = b = c = d |
| 2 | P13 & !e & !i |
| 3 | P31 & e & i |
| 4 | f = g = h = j |
| 5 | e = i = f = g = h |
| 6 | i ! = e = g = h = j |
| 7 | e = i ! = g = h = j) & !(c = d = e) |
| 8 | !P31 & e & !i & !g & !h & !j |
| 9 | !P13 & !e & i & g & h & j |
| 10 | !a & !b & c & d & e & i & !f & !g & !h & j |
| 11 | a & b & !c & !d & !e & !i & f & g & h & !j |

In some exemplary embodiments, a concurrent code checker (C3) may be coupled to a BER counter and/or a multiple input signature register (MISR). The C3 increments the BER counter when an error occurs in the data stream. The value of the BER counter can be used to determine an error rate in the data stream. In some exemplary embodiments, a MISR may compact a data stream and provide a signature at the end of test. The signature may indicate possible errors in the data stream. Compared to conventional Cyclic Redundancy Check (CRC) based check sum methods, a MISR can be implemented with less hardware and use a significantly simpler synchronization mechanism. An exemplary description of a Multiple Input Signature Register (MISR) may be found in the following book: *Digital Systems Testing and Testable Design*, M. Abramovici, M. Breuer, A, Friedman, Wiley-IEEE Press, 1994, which is hereby incorporated by reference.

A cyclic redundancy check (CRC) may typically be a type of hash function used to produce a checksum (usually a small, fixed number of bits) against a block of data, such as a packet of network traffic or a block of a computer file. The checksum may be used to detect errors after transmission or storage. A CRC is computed and appended before transmission or storage, and verified afterwards by the recipient to confirm that no changes occurred on transit. CRCs are popular because they are simple to implement in binary hardware, are easy to analyze mathematically, and are particularly good at detecting common errors caused by noise in transmission channels. The conventional CRC based checksum methods, however, are highly structured in that they require formatting and framing to identify boundary of data and checksum. Similar to PRBS, a checksum needs to be computed at both TX and RX and the checksums at TX and RX need to be synchronized limiting flexibility. Error detection is not instant in a CRC based checksum. Error detection time depends on CRC computation time. The MISR, however, compacts any data stream and produce a signature at the end. Error detection in MISR is instant and the signature (or test result) can be unloaded any time.

Figure 2:
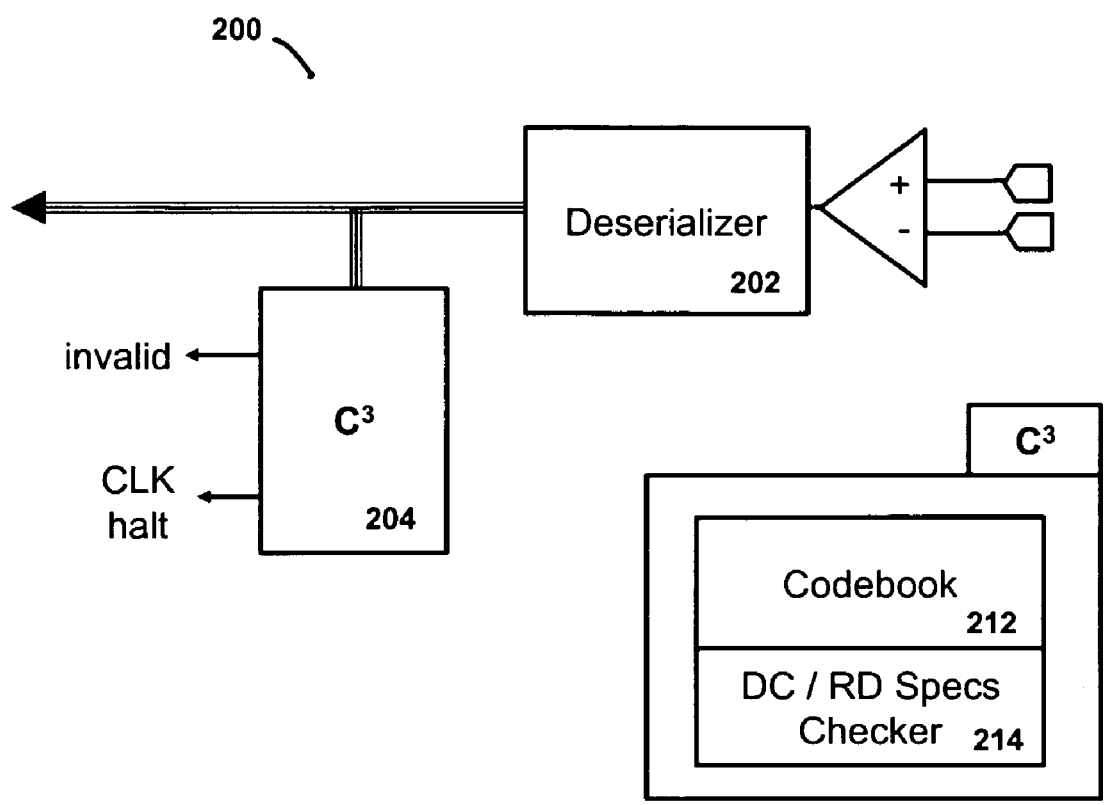
FIG. 2 depicts an exemplary embodiment of HSIO circuitry including a concurrent code checker configured to check encoded data for transmission errors.

In some exemplary embodiments, a C3 may optionally be coupled to a test clock control structure (TCCS). The TCCS may then be used for halting a control clock and allowing debugging to occur. In some exemplary embodiments a TCCS halts a control clock regulating a data bus on receiver circuitry. In some exemplary embodiments a TCCS halts a control clock regulating the transmission of the data stream. In some exemplary embodiments a C3 can be configured to halt operation of the receiver when an error occurs, thereby allowing error debugging to proceed by, for example, examining the internal values of registers. U.S. patent application Ser. No. 11/476,457 entitled Test Clock Control Structures to Generate Configurable Test Clocks for Scan-based Testing of Electronic Circuits using Programmable Test Clock Controllers filed on 27 Jun. 2006 in the name of inventor Chinsong Sul, provides additional information on a particular test clock control structure that may be used in conjunction with the present invention, and which application is incorporated by reference FIG. 2 depicts exemplary HSIO circuitry including a concurrent code checker (C3) configured to check encoded data for transmission errors. The HSIO circuitry 200 includes a deserializer 202 and concurrent code checker (C3) 204.

The deserializer 202 is configured to receive serialized data transmissions. The deserializer 202 is coupled with the C3 204 and sends received data packets to the C3 204. The coupling of the deserializer 202 and the C3 204 may be in any manner known or convenient. In one non-limiting embodiment the coupling or connection is implemented as a data bus.

The C3 204 includes a code book 212 and DC/RD specifications 214. In some exemplary embodiments the C3 may be implemented using circuitry such as combinational logic or read-only memory (ROM). The C3 204 receives data packets from the deserializer 202. The packet may be checked for invalidity while encoded, and invalidity may be determined by using logical equations in the code book 212. In one non-limiting embodiment, this determination using the logical equations in the code book 212 is accomplished by applying the binary data value of the data packet to the logical equations implemented in hardware, the resulting value indicating whether an invalid data packet was used. In some exemplary embodiments a code book produces the DC value of the data packet. DC/RD specifications 214 are the DC and RD rules and/or conditions the encoding scheme satisfies, both as codewords and as codewords in a data stream.

In some exemplary embodiments DC/RD specifications or specs are derived from the encoding scheme and may be related to an error model. In some exemplary embodiments, the DC spec may be $(DC(c_k) \in \{-2, 0, 2\}) \wedge (-2 \leq DC(s_i) \leq 2)$, where DC of data stream $s_i$ is defined as $DC(s_i) = DC(s_{i-1}) + DC(c_i)$ for $i > 0$, where $DC(s_0) \in \{-2, 0, 2\}$.

In some exemplary embodiments the static and dynamic properties of the codewords and data streams are implemented using combinational logic and finite-state-machine (FSM), respectively. In some exemplary embodiments the checking the DC value of a valid codeword is implemented using a combinational circuit such as a 5-bit adder. In some exemplary embodiments the RD aspect of a valid data stream may be determined using logical equations, and in some exemplary embodiment are implemented using a finite state machine which checks if the data stream satisfies the RD specification.

The concurrent code checker may be coupled to the bit-error-rate (BER) counter 206 which is incremented when an invalid data packets or invalid bits in data packets are detected. The BER counter 206 may be implemented by any means known or convenient. In some exemplary embodiments a multiple input signature register (MISR) may be used to collect error information in addition or instead of a BER counter. In some exemplary embodiments a MISR is configured to observe outputs of multiple concurrent code checkers (C3s) simultaneously and may be configured to capture a large number of errors (should they occur) without overflow.

The optional test clock control structure (TCCS) 208 may be used to halt the clock to examine internal registers in order to find the cause of an error or failure. The TCCS 208 may be implemented by any way known or convenient. In some exemplary embodiments a TCCS is configured to control the data bus clock.

FIG. 3 depicts a sample representation of values in an exemplary codebook. The first column depicts a sample of 8-bit words which may be encoded into 10-bit code words. The second column depicts a sample of codewords corresponding to the 8-bit words and encoded negative running disparity or RD−. The third column depicts a sample of codewords corresponding to the 8-bits words and encoded positive running disparity RD+. In some exemplary embodiments the RD− and RD+ values may be interpreted as types. Any DC value of a codewords in the exemplary embodiment should satisfy the relationships: $DC(c_i) \in \{0,2\}$ and $DC(c_i) \in \{-2,0\}$ respectively. The partition of data packets and data streams based on the RD may optionally used to refine the DC specification and allow a greater number of transmission errors to be identified.

In some exemplary embodiments the RD function of codewords and data streams can be further defined. Let $RD_u = RD_- \cup RD_+$, $RD_0 = RD_- \cap RD_+$, $RD'_- = RD_- - RD_0$, and $RD'_+ = RD_+ - RD_0$. The RD type (RDT) function of codeword $c_i$ can be defined as $RDT(c_i) = -1$ and 1, if $c_i \in RD'_-$ and $RD'_+$, respectively. The RD type of codeword $c_i \in RD_0$ can also be defined as $RDT(c_i) = 0$ and the RD type of invalid as $RDT(c_i) = F$. Thus, in some exemplary embodiments the valid codeword $c_i$ should satisfy the following specification: $RDT(c_i) \in \{-1,0,1\}$. In some non-limiting exemplary embodiments using an IBM 8B/10B encoding scheme a set of eleven logical equations may be used to check whether the given codeword is invalid. Other encoding schemes may use or require different numbers or types of logical equations.

In some exemplary embodiments the sets $RD'_-$ and $RD'_+$ can further be partitioned with respect to the DC value of a valid codeword. Partitioning refers to dividing codewords into sets based on invalidity or an error being detected. Let $RD_{-dc} = RD' \cap C_{dc}$ and $RD_{+dc} = RD'_+ \cap C_{-dc}$ for $dc \in \{0,2\}$. Note that $RD_{+dc} \subseteq C_{-dc}$ and $RD_{-dc} \subseteq C_{+dc}$. Similarly, in some exemplary embodiments, the RD function of stream $s_i$ can be defined as $RD(s_i) = RD(s_{i-1}) + DC(c_i)$, where $RD(s_0) \in \{-1,1\}$. The RD function indicates how DC of valid codeword is related to the RD. That is, DC of valid codeword can be expressed in terms of RD of data stream as $DC(c_i) = RD(s_i) - RD(s_{i-1})$. Using the RD function of stream, the DC of valid codeword stream can be written as $DC(s_i) = RD(s_i) + RD(s_0)$ for $i \geq 0$.

In some exemplary embodiments which may for convenience be referred to as specification 1, the RD (test) specification can similarly be defined as $RD(c_i \hat{\ } s_{i-1}) = -RD(s_{i-1})$ for $c_i \in RD_{-2} \cup RD_{+2}$. In some exemplary embodiments, the data stream will be equivalent to the DC specification counterpart, the difference being the RD specification of valid codewords may exclude the unused codewords which satisfy the DC specification.

In some exemplary embodiments a RD (test) specification, which may for convenience be referred to as specification 2, of a data stream can be defined as $P1 \vee P2$, where $P1 = \{(RD(c_i \hat{\ } s_{i-1}) = RD(s_{i-1})) \wedge (c_i \in RD_u \cap C_0)\}$ and $P2 = \{(RD(c_i \hat{\ } s_{i-1}) = -RD(s_{i-1})) \wedge (c_i \in RD_u \cap C_{dc})\}$ for $k > 0$, where $\hat{\ }$ denotes concatenation of data stream and where $dc = -2RD(s_{i-1})$. In some exemplary embodiments P2 includes the RD specification 1. In some exemplary embodiments the RD specifications 1 and 2 are used to refine the DC specification and allow a larger number of errors to be detected.

Figure 4:
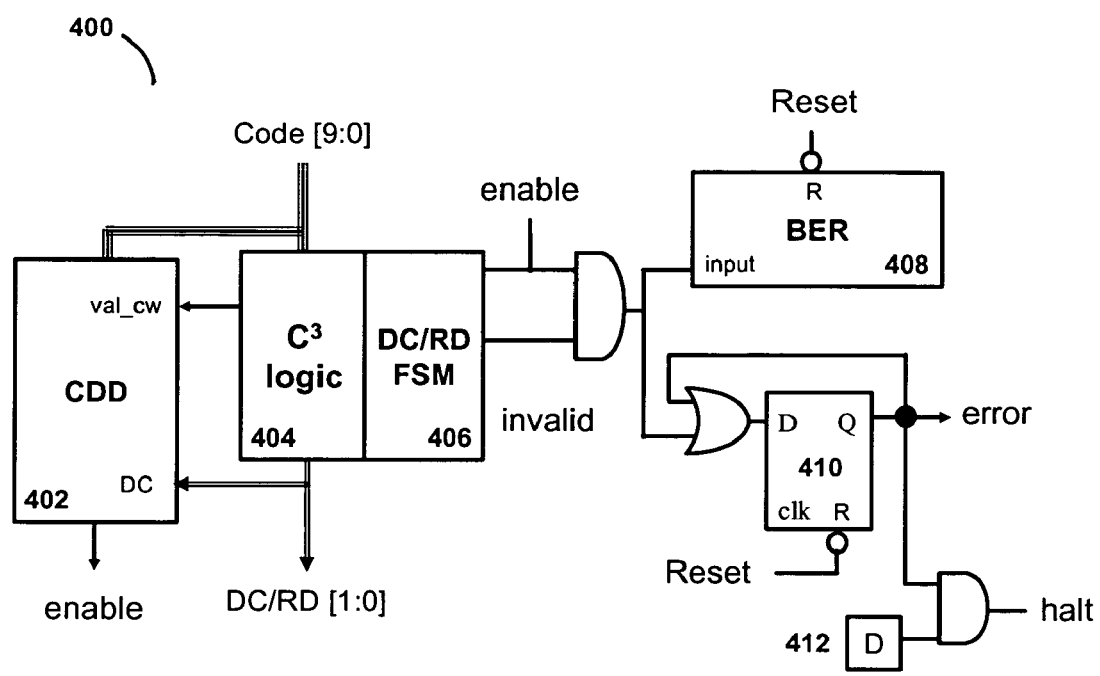
FIG. 4 depicts the internal structure of an exemplary embodiment of a concurrent code checker.

FIG. 4 depicts the internal structure of an example concurrent code checker 400. The concurrent code checker 400 includes a code delimiter detector (CDD) 402, concurrent code checker (C3) logic 404, a running disparity finite state machine (RD FSM) 406, a MISR/Counter 408 and clock halting circuitry 410.

The C3 logic 404 receives incoming codewords as input. The C3 can check the codeword for invalidity, and produces a DC and/or RD value for the codeword passed to the DC/RD FSM 406. In some exemplary embodiments C3 logic can provide codeword validity to and DC value a CDD 402 to synchronize the beginning of an input data stream. In some exemplary embodiments C3 logic can provide DC and/or RD values to a DC/RD FSM to track DC/RD synchronization. In some exemplary embodiments, when a CDD detects a valid codeword boundary the CDD can enable a DC/RD FSM, a BER counter, and/or clock halting circuitry.

The CDD 402 may use a special control character and the valid signal from C3 404 to synchronize the valid codeword boundary. In some non-limiting exemplary embodiments a control character, such as a K28.3 control character, may be used. K28.3 control characters are known in the art and are described in Serial A TA Storage Architecture and Applications, by K. Girmsrud and M. Smith, Intel Press, 2003 (P130), which is hereby incorporated by reference. The CDD 402 may, upon detecting the control character, generate the enable signal to initiate the DC/RD check. In some exemplary embodiments, loading control flip-flops allows a desired synchronization scheme to be enabled. In some exemplary embodiments, a CDD can generate the valid signal allowing the removal of any special character detection circuitry. In some exemplary embodiments, a CDD is optional because a system will already include a CDD and the CDD from the system may be reused allowing the removal of a dedicated CDD from the circuit. In some exemplary embodiments, if one or more than one valid codewords are received, a DC/RD FSM may be enabled to check the validity of the data stream, and, in some exemplary embodiments, allowing synchronization via a valid (or invalid) codeword signal or DC value.

The RD FSM 406 may be enabled when a codeword boundary is detected, and checks for correct sequence of DC/RD. The DC and/or RD value of the codeword is calculated by the C3 logic 404 which may provide the resulting value to DC/RD FSM to determine validity of codeword. In some exemplary embodiments the DC coupled with RD type may be applied to the calculation of RD. In some exemplary embodiments, a RD FSM is a self-synchronizing FSM. In some exemplary embodiments, an invalidity signal produced by a code error checker (CEC) may be used for self synchronization. If a valid codeword or a number of consecutive valid codewords were detected, the test control unit 504 may enable a DC/RD FSM to initiate error detection. The DC/RD FSM may start in state S and makes a transition to valid DC or RD states when a codeword that can decide state of DC or RD of data stream is encountered. For example, if a codeword of type $C_{+2}$ or $RD_{-0}$ is encountered, the DC/RD FSM may use a position of the codeword to track DC or RD value of data stream. Thus, the desired synchronization is established. If a data packet is changed to the control character by error, synchronization can be regained after it registers an error.

The C3 logic 404 is implemented based on the derived DC/RD specification. The C3 logic 404 considers the DC/RD specifications of the valid codeword and data stream. The DC value of a data stream is provided to the RD FSM 406 by the C3 logic 404. If the DC value of the codeword is invalid, the C3 logic may provide an invalid signal to the RD FSM 406, which asserts an invalid signal. In some exemplary embodiments, the C3 logic may be implemented by using a 5-bit adder and one or more DC mapping circuits to implement a C3 logic block.

The D flip-flop 412 represents a control flip-flop which can activate and deactivate the clock halt signal. In some exemplary embodiments, a control flip-flop can be accessed externally via an Inter-IC bus (I2C) or may be controlled internally.

Figure 5:
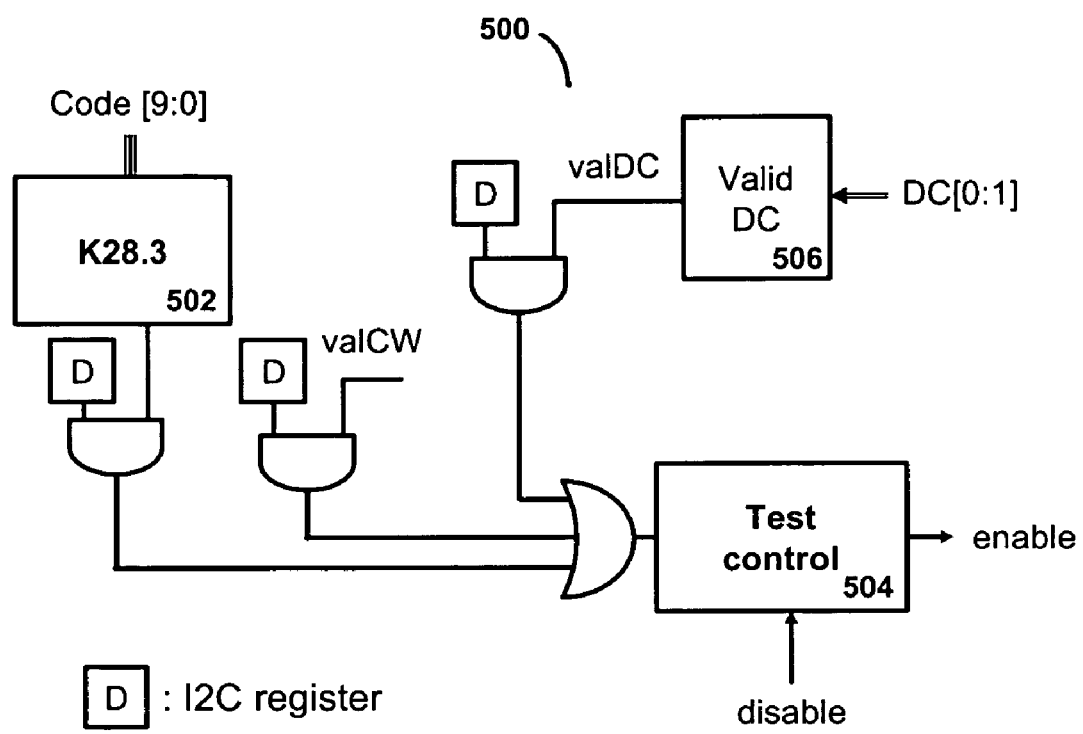
FIG. 5 depicts the internal structure of an exemplary embodiment of a code delimiter detector (CDD).

FIG. 5 depicts an exemplary embodiment of the internal structure of an example code delimiter detector (CDD) 500. The CDD 500 includes a K28.3 detector 502, test control circuitry 504, valid DC detector 506 and valid codeword signal (val_cw) from the C3 logic. The K28.3 detector 502 is able to detect a K28.3 control character and to initiate a DC/RD check. The valid DC 506 detects valid DC value and outputs valid DC (valDC=1) if valid DC value is detected. When K28.3 is detected, the test control circuitry enables a DC/RD FSM to check the validity of a codeword and a data stream. In an exemplary embodiment, the valid codeword (val_cw) signal or valid DC (valDC) is used to detect the beginning of data stream. In some exemplary embodiments, if one or a predefined number of valid codeword or of DC values is encountered, a test control enables the C3. Alternative disable signal can be provided to disable the test control 504 that disables the DC/RD FSM and other circuitries that it enables. Other alternative detectors may be utilized that perform this or the equivalent function. In some exemplary embodiments a CDD is used to synchronize a C3.

Figure 6A:
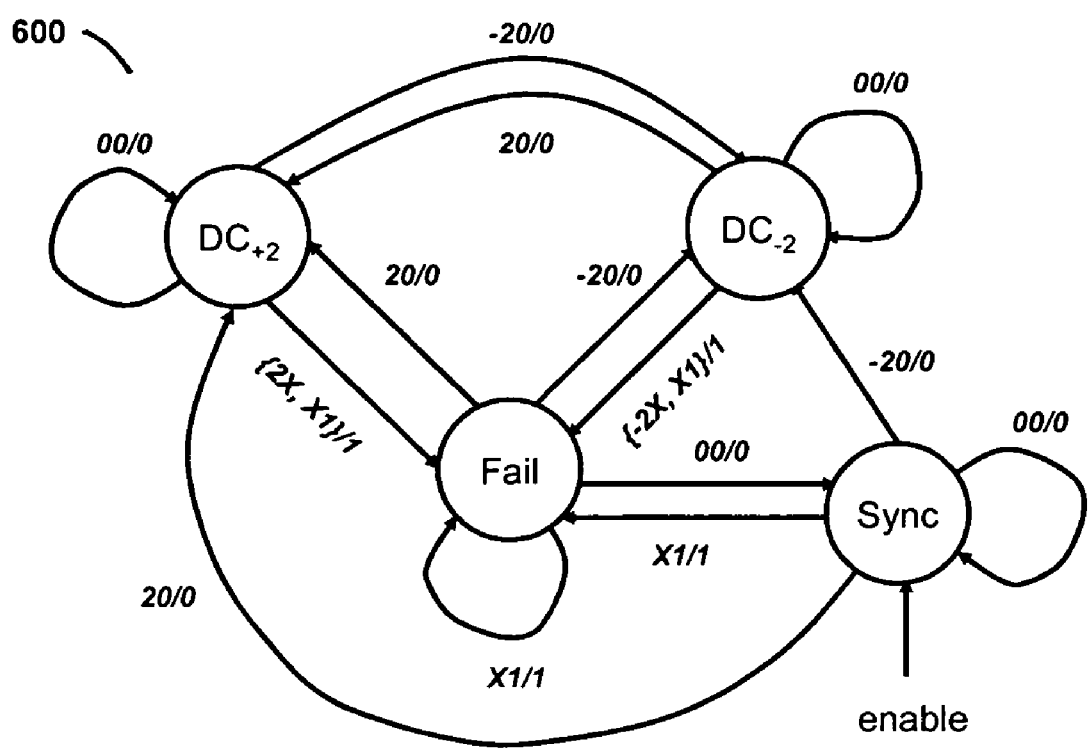
FIG. 6a depicts an example finite-state-machine used in an exemplary embodiment of a self-synchronizing DC checker for DC specifications.

FIG. 6a depicts an exemplary finite-state-machine (FSM) 600 for an exemplary self-synchronizing DC checker for a DC specification. The FSM 600 produces the DC of a codeword after determining the codeword is valid. The exemplary finite state machine depicted illustrates conditions both when a codeword is valid, and when an invalid codeword is detected transferring the system into a fail state. Table 2 shows example DC values and corresponding 2-bit representation. Table 3 shows example RD values and corresponding 2-bit representation.

In some exemplary embodiments, the FSM 600 allows the determination of invalid DC values and a subset of invalid RD values. If an invalid value is reached then FSM 600 goes into the "fail" state. The "Sync" state indicates the state of FSM 600 and is used as a waiting state to synchronize into the correct DC or RD states when a new data stream is received or when the FSM is recovering from the error (Fail) state.

Figure 6B:
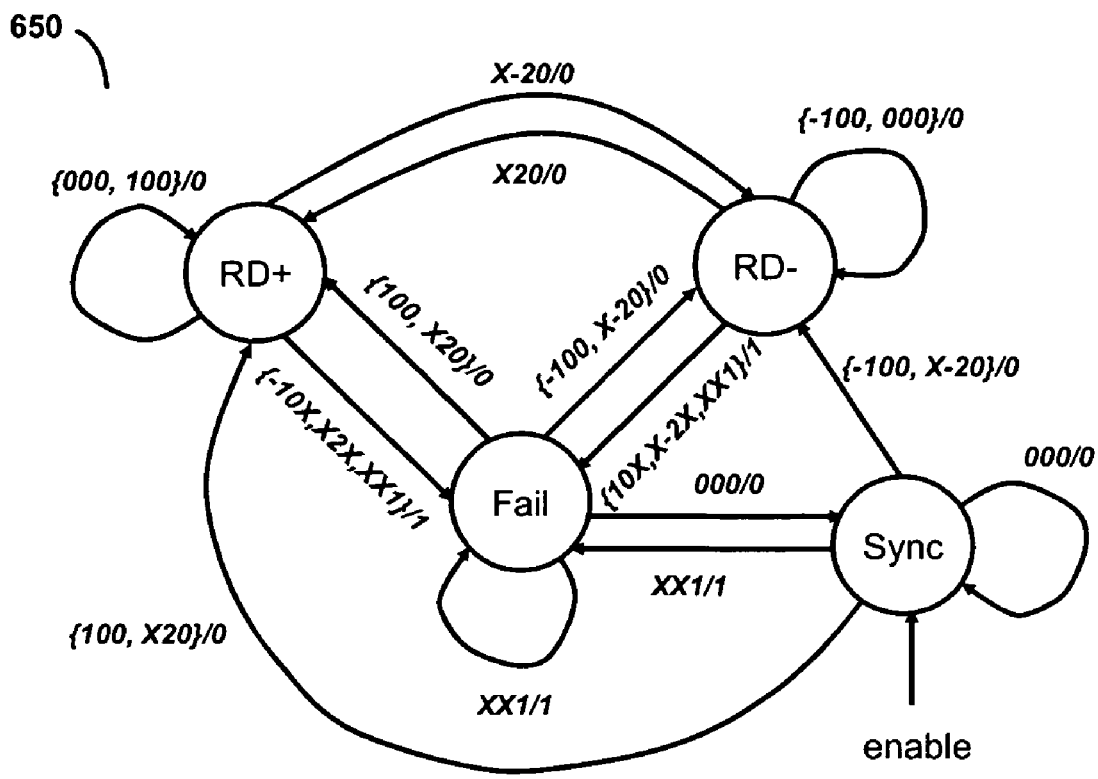
FIG. 6b depicts an exemplary embodiment of a finite-state-machine used in an exemplary embodiment of a self-synchronizing running disparity (RD) checker for RD specifications.

FIG. 6b depicts an example of a self-synchronizing finite-state-machine (FSM) 650 used to implement an exemplary RD specification. When a RD FSM receives an enable signal the RD FSM waits for the proper RD type to synchronize the starting point for the RD tracking. The implementation of the finite state machine in FIG. 6b allows the RD FSM to detect errors related to codewords of $RD_{-0}$ and $RD_{+0}$ types, when the input transitions into "fail" state. In some exemplary embodiments, a second finite state machine FSM 650 is used with the first finite state machine FSM 600 to check for a larger number of possible errors in a data stream. When FSM 650 is used in conjunction with FSM 600 reaching the "Fail" state in either FSM will indicate an error. FSM 650 reduces to FSM 600 if RDT is masked (i.e., RDT=0).

Figure 7:
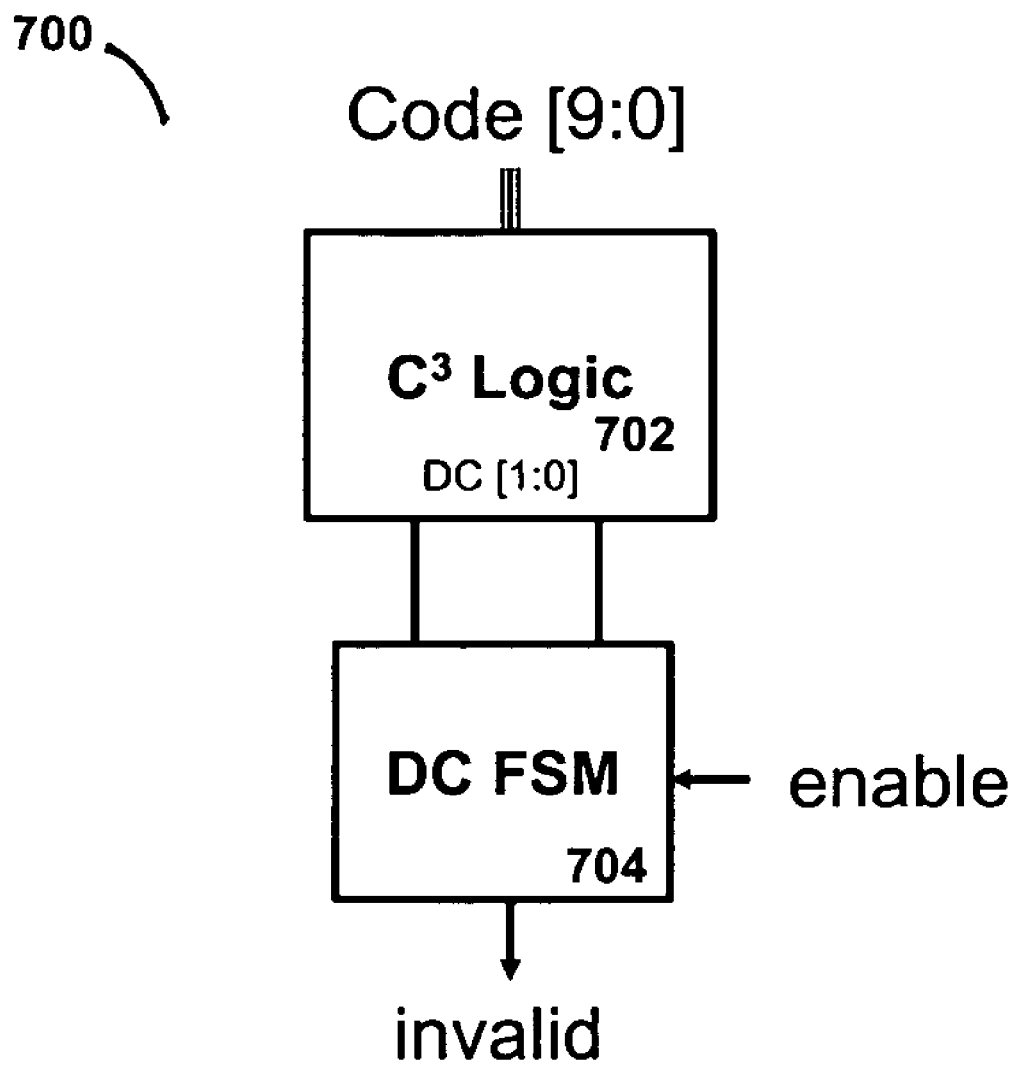
FIG. 7 depicts an exemplary embodiment of an implementation of error detection circuitry.

FIG. 7 depicts an example implementation of error detection circuitry 700. The error detection circuitry includes C3 logic 702 and a DC FSM 704. The C3 logic 702 produces a DC value that is output and passed or otherwise communicated to the DC FSM 704 and used by the DC FSM 704 to update state. Table 4 shows an exemplary embodiment in which a 10-bit codeword is used and mapped by the C3 logic to a 2-bit output.

TABLE 2

Exemplary DC Values

| DC | DC[1:0] |
|---|---|
| −2 | 0 1 |
| 0 | 1 1 |
| 2 | 1 0 |
| Unused | 0 0 |

TABLE 3

Exemplary RD Values

| RD | RD[1:0] |
|---|---|
| −1 | 0 1 |
| 1 | 1 0 |
| Unused | 1 1 |
| Unused | 0 0 |

TABLE 4

Exemplary 10-bit Codeword DC Mapping

| Code [9:0] | DC[1:0] |
|---|---|
| −2 | 0 1 |
| 0 | 1 1 |
| 2 | 1 0 |
| Invalid | 0 0 |

TABLE 5

Exemplary DC Mapping

| Adder Value | DC[1:0] |
|---|---|
| 4 | 0 1 |
| 5 | 1 1 |
| 6 | 1 0 |
| Invalid | 0 0 |

Figure 8:
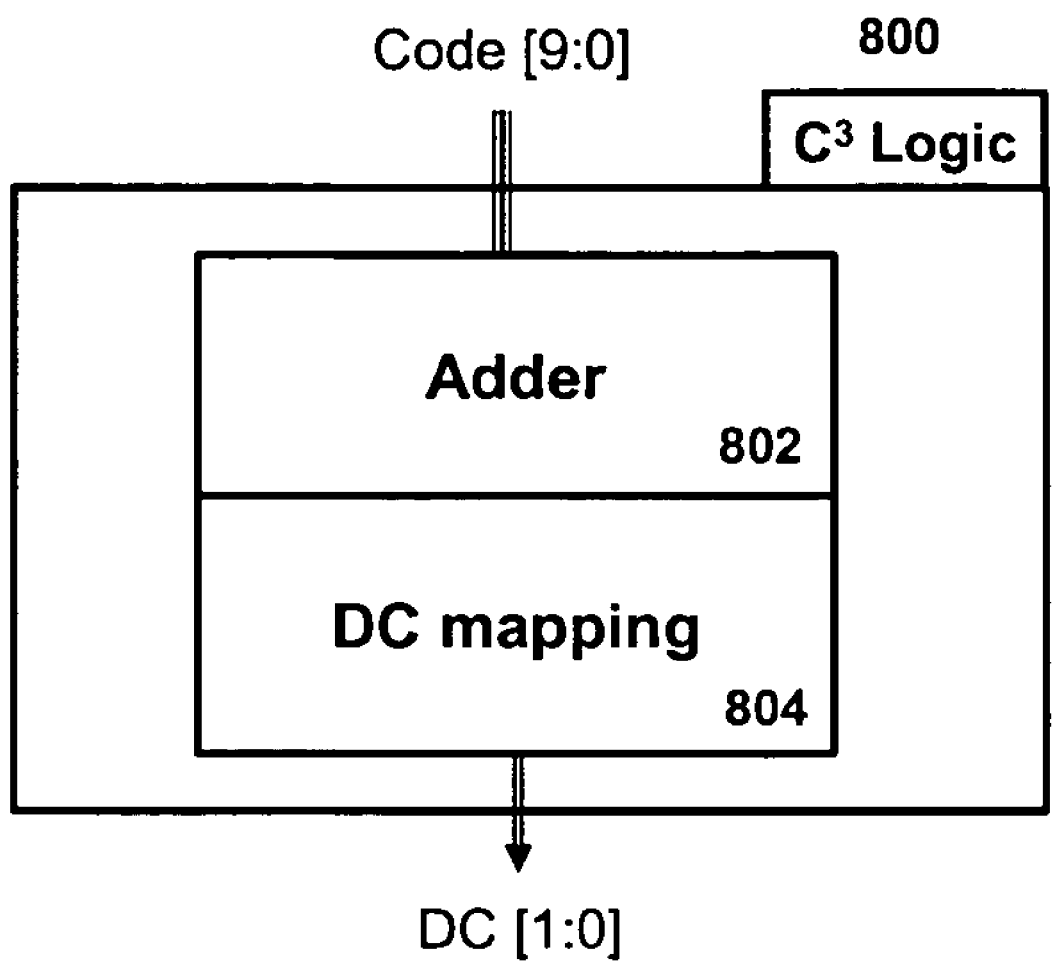
FIG. 8 depicts an exemplary embodiment of an implementation of concurrent code checker logic.

FIG. 8 depicts an exemplary embodiment of an implementation of concurrent code checker (C3) logic 800. The C3 logic includes an adder 802 and DC mapper 804. The adder 802 may be implemented as any adder known or convenient for the encoding scheme used. For example, in the non-limiting embodiment using an IBM 8B/10B encoding scheme a 5-bit adder may be used to implement the C3 logic block.

The DC mapper 804 maps the DC value to a mapped DC value. In a non-limiting exemplary embodiment using the IBM 8B/10B encoding scheme, a DC mapper maps the DC value to a corresponding 2-bit encoded DC value, DC[1:0]. Table 5 shows an exemplary embodiment in which a 5-bit adder values are mapped to DC[1:0]. In some exemplary embodiments, unused codewords may be entered as valid in the truth table. For example, unused codewords in the non-limiting example of an IBM 8B/10B encoding may have a valid DC value of −2, 0, and 2. Some examples of unused invalid codewords in an IBM 8B/10B encoding which have the valid DC values are the codewords 4160, 5051, and 4061, where the codeword "M1N0" or "N0M1" denotes the 10-bit codeword composed of M number of 1s and N 0s.

In some exemplary embodiments, the RD specification of valid codewords may be used to detect the unused codewords that satisfy the DC specification. In most situations, to implement the RD specification a complete codebook must be implemented. In a non-limiting exemplary embodiment using an IBM 8B/10B encoding scheme, a code error checker is available for the IBM 8B/10B encoding scheme using eleven logical equations to separate valid codewords from invalid.

Figure 9:
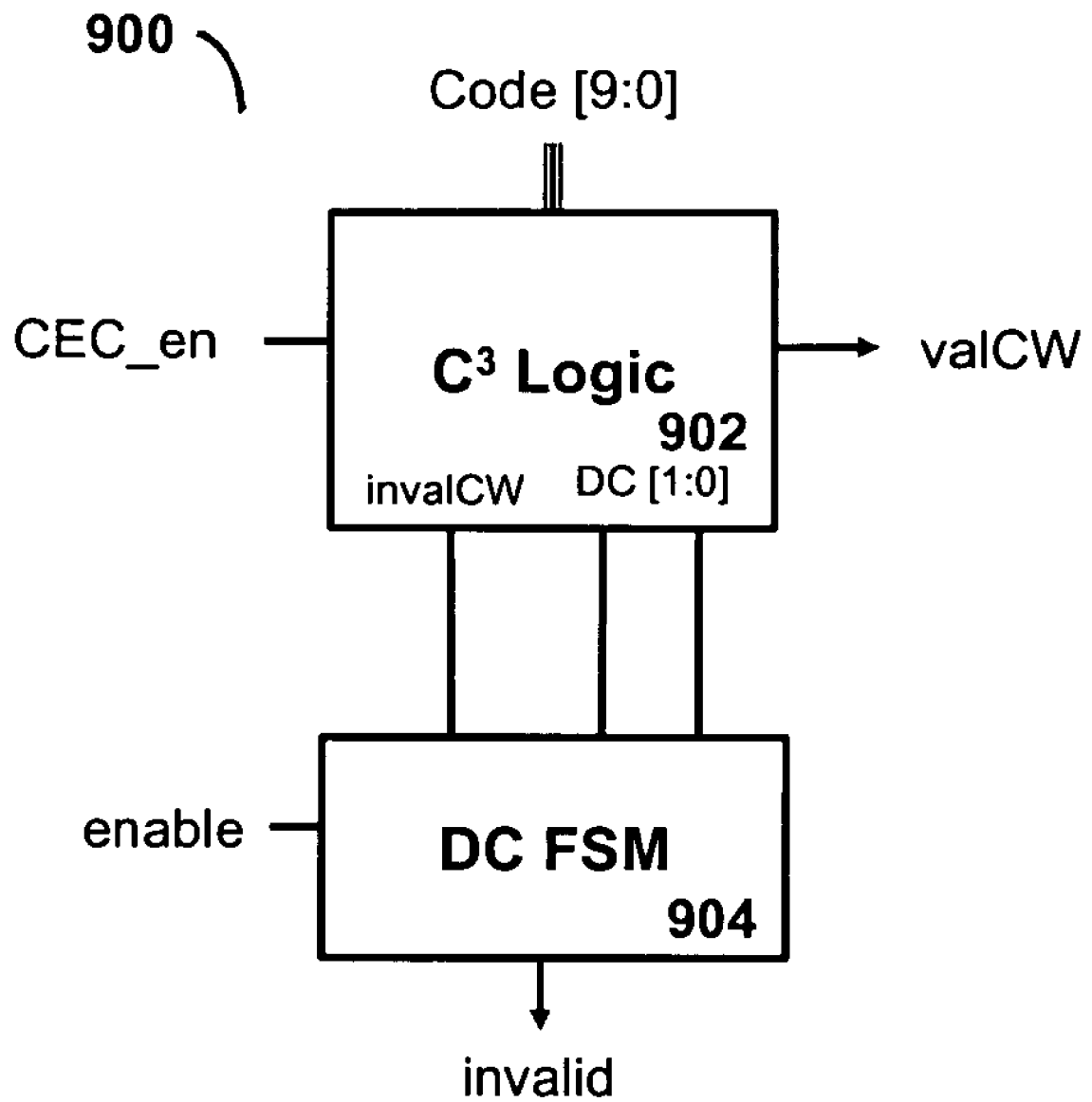
FIG. 9 depicts an exemplary embodiment of an implementation of DC logic which verifies the DC specification of a codeword and the DC specification of a data stream.

FIG. 9 depicts an exemplary implementation of DC/RD logic 900 which is adapted for verifying the validity of a codeword and data stream. DC/RD Logic 900 includes C3 logic 902 and a FSM 904.

Figure 10:
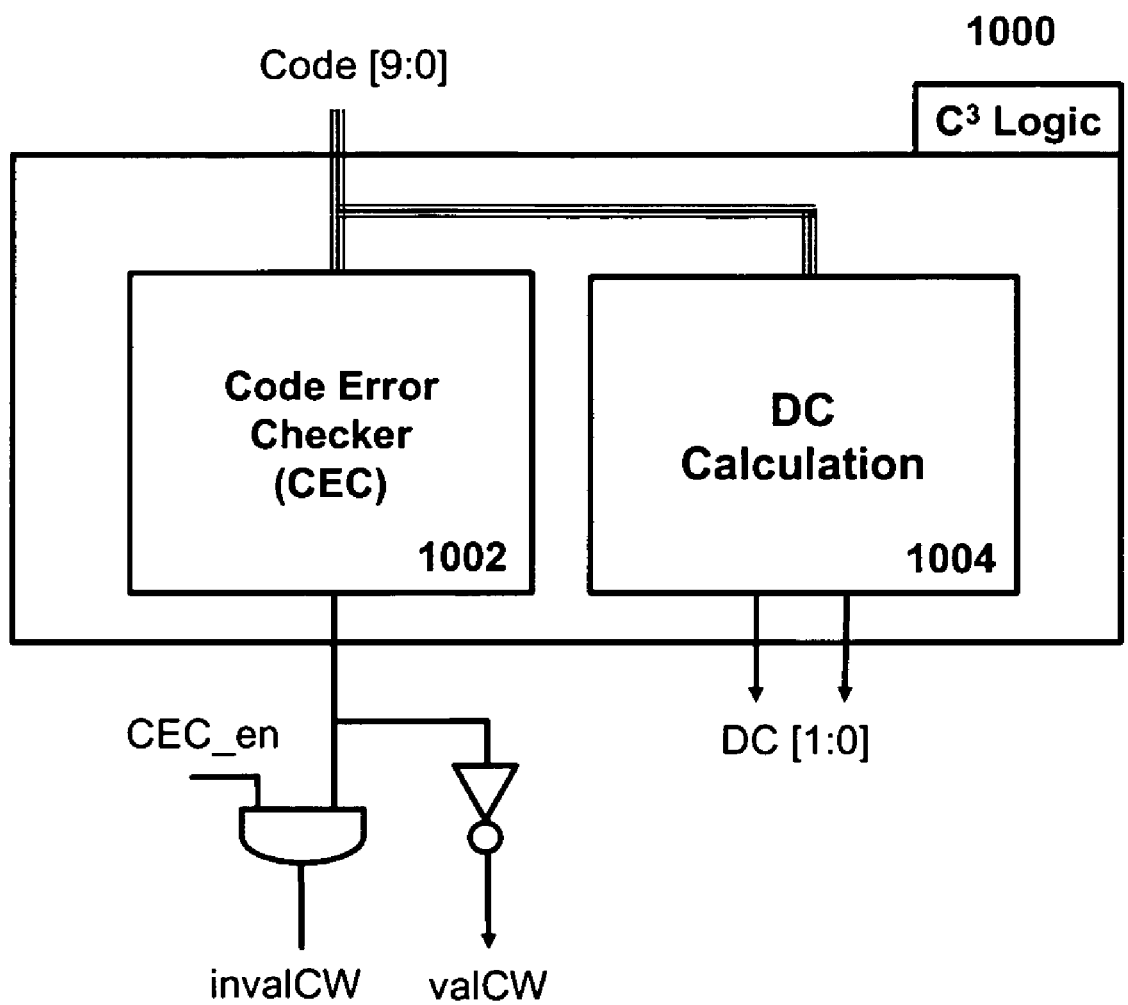
FIG. 10 depicts an exemplary embodiment of an implementation of concurrent code checker logic.

FIG. 10 is an illustration depicting exemplary C3 logic 1000. The C3 logic 1000 includes a code error checker (CEC) 1002 and a DC calculation logic 1004.

In some exemplary embodiments, the C3 logic 1000 depicted in FIG. 10 may be used as C3 logic 902 in FIG. 9. The code error checker (CEC) 1002 validates codewords which are passed on to FSM 904, thus allowing the FSM 904 to operate under the assumption that only valid input codewords will be received. In some exemplary embodiments an error may occur in a codeword but the modified codeword may be still technically valid when considered without the context of a data stream, and will be validated by an error checker and sent to a FSM to determine if the codeword is invalid in context of the data stream. In an exemplary embodiment, when the codeword is invalid the code error checker 1002 will assert an "invalid" signal forcing the FMS 904 to fail or error state. Thus, in certain embodiments, when the code error checker signal asserts the invalid signal the output of a DC or RD calculation circuit is in a "don't-care" state. In certain exemplary embodiments, using a don't-care signal when an invalid codeword is encountered can be used to minimize logic (or hardware) in a DC/RD calculation circuit In some exemplary embodiments a reduction is possible by reducing the number of required states in which a DC calculation circuit, RD calculation circuit, and/or some other DC/RD combination calculation circuit must produce valid output.

Figure 11:
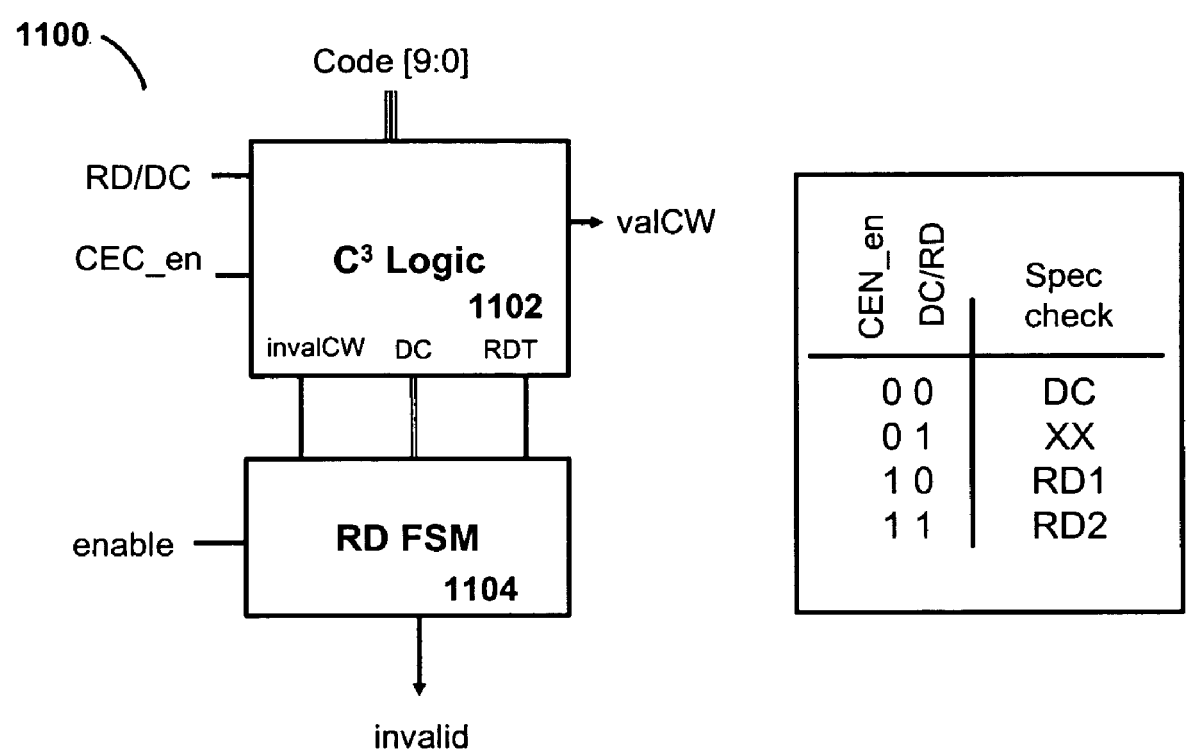
FIG. 11 depicts an exemplary embodiment of an implementation of DC/RD logic which verifies the DC and RD specifications of a codeword and a data stream.

FIG. 11 depicts an exemplary implementation of DC/RD logic 1100 which verifies the DC specification of a codeword and the RD specification of a data stream. The DC/RD logic 1100 includes C3 logic 1102 and a FSM 1104.

The FSM 1104 models the state of the data stream using one or more finite-state-machines according to the encoding scheme used. For example, the RD of the data stream could be modeled according to an IBM 8B/10B encoding scheme and as the FSM models described previously in FIGS. 6a and 6b. The state of the FSM 1104 is updated by values received from the C3 logic 1102. A control signal DC/RD may be added to provide selection of the DC specs or RD specs to be checked. In some example embodiments, a control signal CEC_en may be added to enable or disable a code error checker. Table 6 provides some exemplary embodiments of possible control signals.

Figure 12:
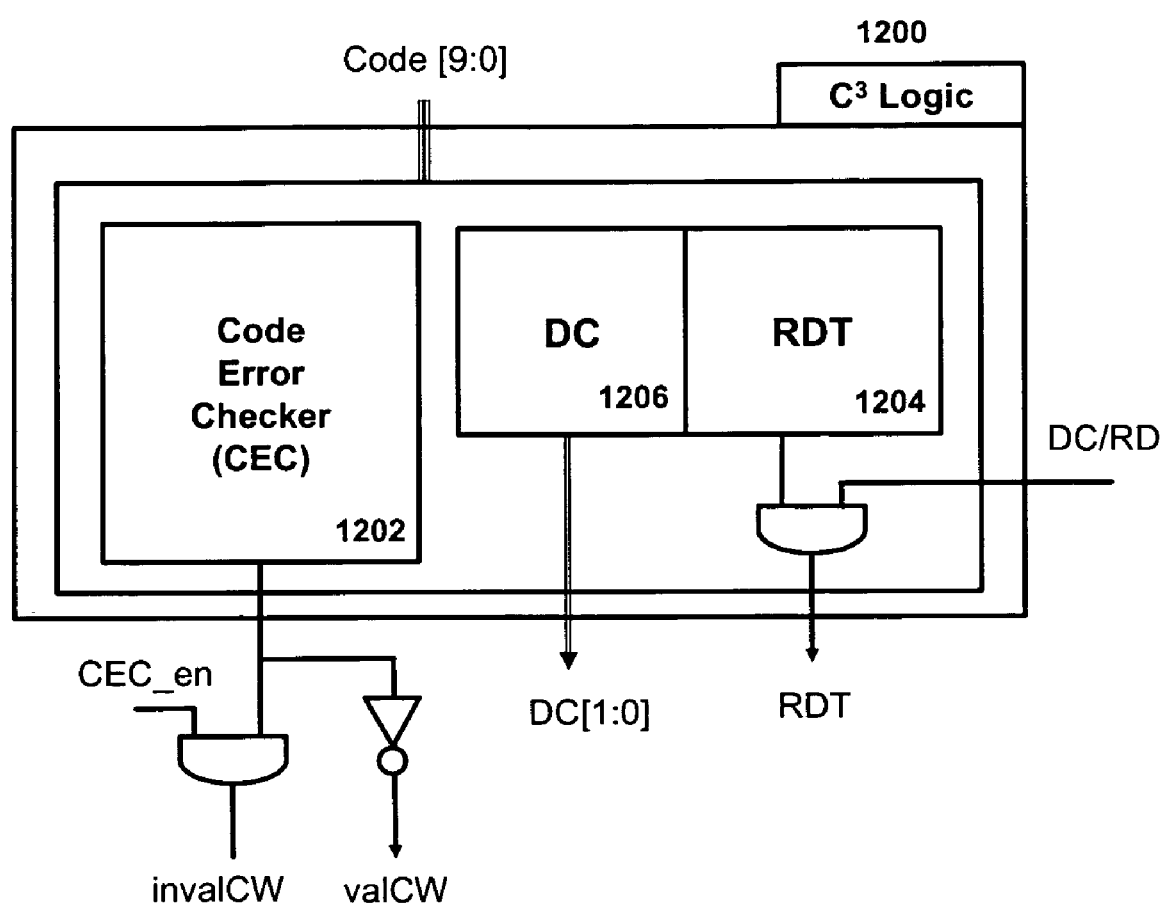
FIG. 12 depicts an exemplary embodiment of an implementation of concurrent code checker logic.

FIG. 12 depicts an exemplary embodiment of an implementation of concurrent code checker (C3) logic 1200. The C3 logic 1200 includes a code error checker (CEC) 1202, RD type (RDT) logic 1204 and DC logic 1206. In some exemplary embodiments the depicted in FIG. 12 may be used as C3 logic 1102 in FIG. 11.

TABLE 3

Exemplary C3 Spec Selection

| CEN_en | DC/RD | Spec Check |
|--------|-------|------------|
| 0 | 0 | DC |
| 0 | 1 | XX |

TABLE 3-continued

Exemplary C3 Spec Selection

| CEN_en | DC/RD | Spec Check |
|--------|-------|------------|
| 1 | 0 | RD1 |
| 1 | 1 | RD2 |

The CEC 1202 may be configured to output an "invalid" signal when an invalid codeword is received. In some exemplary embodiments, the CEC 1202 may also be configured to output a complementary signal (i.e., "valid"). In some exemplary embodiments the codeword will be received from a data bus. In some exemplary embodiments the invalid signal may be a high voltage signal (binary 1) or a low voltage signal (binary 0) depending on the desired implementation. The CEC 1202 may be implemented in any manner known or convenient, such as logic circuitry or read-only memory (ROM).

The RD type logic 1204 may be configured to determine the "RD type" of the codeword, as the RD type would be applied to a FSM modeling the RD of a data stream. The RD type of the codeword is dependent on the encoding scheme used in the implementation. For an example using IBM 8B/10B see the definition of specification 2 described above.

The DC logic 1206 may be configured to determine the DC value of the codeword. For example, if the codeword has two more 0s than 1s the DC value is −2. The DC logic 1206 and RD type logic 1204 may be coupled with mapping logic 1208. The mapping logic 1208 may map values produced by DC logic 1206 and RD type logic 1204 and map the results to a binary value for use by a FSM modeling the state of the data stream.

In some exemplary embodiments, when a test requires the unused codewords to be included in a test pattern and considered valid in others, the C3 1200 is configurable so both DC and RD specifications may advantageously be implemented. The RD specification may be implemented by using two control signals, a CEC enable (CEC_en) control signal and a DC/RD control signal to configure a C3. The CEC enable control signal may be used to determine whether the CEC is included in the test, and the DC/RD control signal may be used to select the DC or RD specification. In some exemplary embodiments, with control of CEC being enabled or disabled, the DC, RD specification 1 and 2 can be implemented via the mapping circuit programming the DC/RD. In some exemplary embodiments, the output of the CEC may conditionally be enabled by a CEC enable signal which can be provided externally or internally as required. In some exemplary embodiments, the CEC enable signal may be used to mask or filter the invalid signal allowing more diversified codewords (or test inputs) during testing or use.

In some exemplary embodiments, the C3 logic may be implemented using read-only memory (ROM). The validity of codewords, in some embodiments including RD and DC value may be programmed into each location of ROM and the codeword may be used as an address input to ROM. The ROM may implement for any codeword under test an invalid or valid status, regardless of the actual validity of the codeword in the corresponding encoding scheme, thereby allowing a greater variety of testing options.

Figure 13:
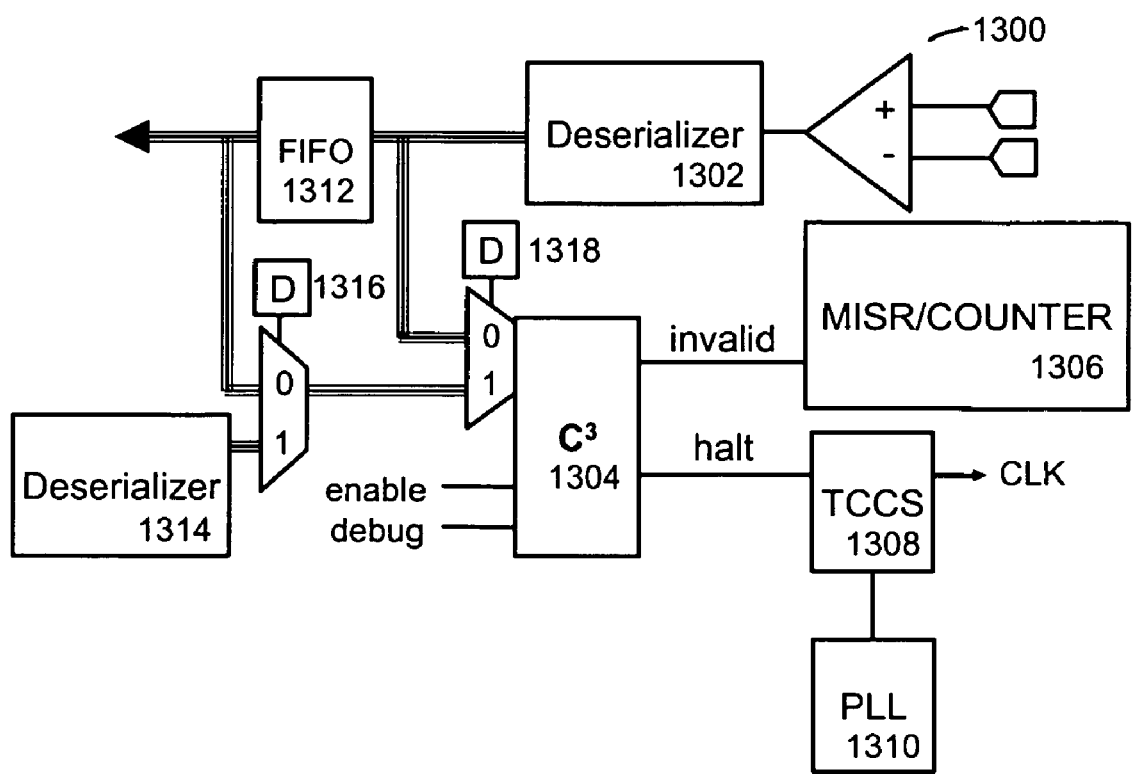
FIG. 13 depicts an exemplary embodiment of circuitry for error detection in test patterns of data.

FIG. 13 depicts exemplary circuitry for error detection circuit or logic 1300 in test patterns of data. The circuitry for error detection 1300 includes a first deserializer 1302, a concurrent code checker (C3) 1304, a MISR/counter 1306, a test clock control structure (TCCS) 1308, a phase-lock loop (PLL) 1310, a first-in-first-out (FIFO) buffer such as for example an FIFO 1312, a second deserializer 1314, a first D register 1316, and a second D register 1318.

The error detection circuitry 1300 shows how the C3 logic 1304 may be shared and configured to observe any de-serialized bus. The different programming can be implemented by programming the D registers 1316 and 1318. In some exemplary embodiments, a custom test pattern or data set can be applied to target faults which induce errors. In some exemplary embodiments, during normal function or operational mode the C3 may be enabled to monitor the traffic on or from the desired location. In some exemplary embodiments, a test pattern of data will be produced by a Pseudo-Random Binary Sequence (PRBS). In some exemplary embodiments the first and second D registers 1316 and 1318 are control flip-flops which may be controlled both internally by the circuit or related circuitry or externally.

Figure 14:
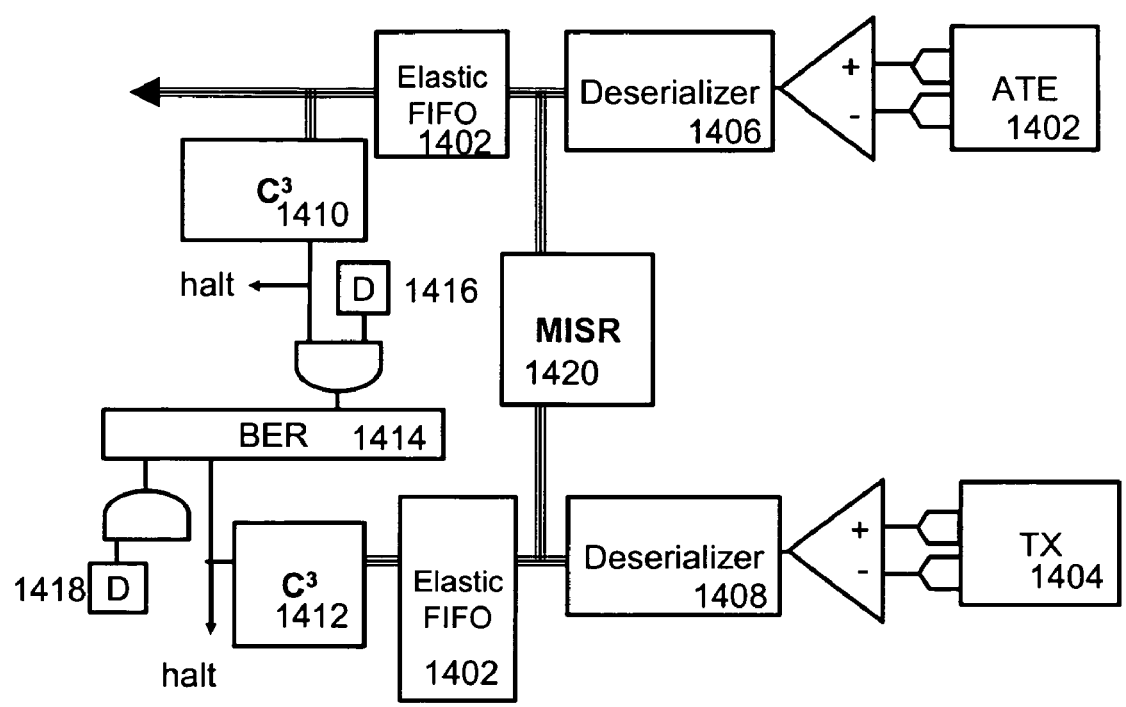
FIG. 14 depicts an alternate exemplary embodiment of circuitry for error detection in test patterns of data.

FIG. 14 depicts alternate exemplary circuitry for error detection 1400 in test patterns of data. The circuitry for error detection 1400 includes an automated test equipment (ATE) 1402, a transmitter/PRBS 1404, a first deserializer 1406, a second deserializer 1408, a first concurrent code checker (C3) 1410, a second concurrent code checker 1412, a BER counter 1414, a first FIFO 1416, a second FIFO 1418 and a MISR 1420.

The first deserializer 1406 and second deserializer 1408 may be configured receive data streams simultaneously. The first and second deserializers 1406 and 1408 are coupled to the first and second FIFOs 1420 and 1422, respectively. The first and second FIFOs 1420 and 1422 are in turn coupled to the first and second concurrent code checkers (C3) 1410 and 1412. The C3s 1410 and 1412 check received data packets for validity sent from the respective coupled FIFOs to determine if a transmission error has occurred. In some exemplary embodiments the C3s will verify validity of the individual received packet and in context of the respective data stream of which the data packet is part. The BER counter 1414 may be coupled to both the first C3 1410 and the second C3 1412, and may be configured to increment the internal counter value when either the first C3 1410 or the second C3 1412 encounters a transmission error.

The circuitry for error detection 1400 demonstrates how periphery hardware such as a BER counter and TCCS can be shared. In some exemplary embodiments, different sources of test patterns may concurrently be applied to the first and second deserializers 1406 and 1408, thereby being closer to mimicking functional operation in the field, such as when a receiver may be used to receive real world data rather than test data. In some exemplary embodiments, a Bit-Error-Rate (BER) counter may also be enabled during normal functioning to collect BER from multiple C3s. In some exemplary embodiments, a test pattern of data will be produced by a PRBS. In some exemplary embodiments, an elastic FIFO may be used for the FIFO 1416 and/or FIFO 1418.

In some exemplary embodiments, the C3 1102 and C3 1200 in FIG. 11 and FIG. 12 respectively, are supersets of C3 902 and C3 1000 in FIG. 9 and FIG. 10 and which may be supersets of C3 702 and C3 800 in FIG. 7 and FIG. 8. In some exemplary embodiments, if RDT in FIG. 12 is disabled (output of RDT=0), the circuit 1200 may be equivalent to C3 in FIG. 9 and FIG. 10. In some exemplary embodiments, if both CEC and RDT are disabled, the circuit 1200 may be equivalent to FIG. 7 and FIG. 8.

Figure 15:
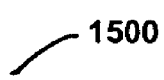
FIG. 15 depicts a flowchart of an exemplary embodiment of a procedure for error checking encoded data.

FIG. 15 depicts a flowchart 1500 of an exemplary embodiment of a method of error checking encoded data. The method includes steps of receiving incoming serialized encoded data packet 1502, deserializing the incoming serialized encoded data packet 1504, checking validity of data packet, deriving a DC value of the deserialized encoded data packet 1506, determining whether the DC or RD value is invalid 1508, and if the deserialized encoded data packet does not have a valid DC or RD value flagging the incoming data as failed 1510.

Turning attention to a further embodiment of the invention, it may be appreciated that the invention includes embodiments of a method for testing a capability of a concurrent code checker (C3) logic with a data stream in a system. In one embodiment, the method may include programming at least one register in the concurrent code checker (C3) logic to configure the system into a testing mode. The method may also include monitoring codewords and determining a number of valid codewords detected during that monitoring. The method may further include determining if a predetermined number of valid codewords are detected, the test control circuitry in the code delimiter detector CDD enabling a running disparity finite state machine (RD FSM) to check validity of a data stream. It may further include when the RD FSM is enabled, using the RE FSM to monitor the data stream and to properly synchronize to the data stream. Embodiments of this method may further include after synchronization, the C3 continuously tracking the test specification until done. Embodiments of the method may also include when testing is completed, disabling the concurrent code checker (C3) logic.

At least one embodiment of the method for testing a capability of a concurrent code checker (C3) logic with a data stream in a system may further provide for the configuring of the system into a testing mode comprises configuring the system into an online testing mode. In one embodiment, the online testing mode may further include: enabling a valid codeword (valCW) in the code delimiter detector (CDD) to synchronize beginning of a data stream; configuring code error checker control signal (CEC_en) for enabling a CEC and a DC/RD control signals (DC or RD spec check) for selecting a test specification from available test specifications.

In another embodiment of the method for testing a capability of the concurrent code checker (C3) logic, the method may provide that the available test specification comprise a DC specification, an RD specification, and combinations of the DC and RD specifications.

In another embodiment of the method for testing a capability of the concurrent code checker (C3) logic, the method may provide that the method further comprises initially starting normal system operation; and then configuring the system into an online testing mode.

In another embodiment of the method for testing a capability of the concurrent code checker (C3 logic) logic, the method may provide that while the system is running, programming Inter-IC bus (I2C) registers in the C3 logic to configure the system into a testing mode.

In another embodiment of the method for testing a capability of the concurrent code checker (C3 logic) logic, the method may provide that the testing mode comprises an online testing mode.

In another embodiment of the method for testing a capability of the concurrent code checker (C3 logic) logic, the method may provide that the at least one register comprises at least one Inter-IC bus (I2C) register.

In another embodiment of the method for testing a capability of the concurrent code checker (C3 logic) logic, the method may provide that the at least one register comprises a plurality of Inter-IC bus (I2C) registers.

In another embodiment of the method for testing a capability of the concurrent code checker (C3 logic) logic, the method may provide that the step of disabling the C3 is accomplished by disabling the test control unit.

In another embodiment of the method for testing a capability of the concurrent code checker (C3 logic) logic, the method may provide that the disabling or the test control unit is accomplished by programming the disable signal via the I2C.

In another embodiment of the method for testing a capability of the concurrent code checker (C3 logic) logic, the method may provide that the step of after synchronization continuously tracking the test specification until done further comprises the step of: if error is encountered, incrementing a Bit Error Rate (BER) counter.

In another embodiment of the method for testing a capability of the concurrent code checker (C3 logic) logic, the method may provide that the method further includes observing the content or count of the BER counter to determine the number of errors as an indication channel quality at field.

In another embodiment of the method for testing a capability of the concurrent code checker (C3 logic) logic, the method may provide that the test specification is selected from the set of test specifications comprising a DC test specification, an RD test specification, and combinations of these.

In another embodiment of the method for testing a capability of the concurrent code checker (C3 logic) logic, the method may provide that the programming is performed while the system is running.

Embodiments of the invention also provide for circuit logic optimization. Logic optimization to reduce hardware is often carried out by commercial Electronic Design Automation (EDA) logic synthesis tool. The fact is that the more don't-care conditions that are specified in the truth table for a logic circuit or array or set of logic circuits, the simpler and more compact the hardware implementing that logic circuit, or set or array of logic circuits can be. For example, the circuitry that may result from specifying a logic truth table from one specifying logic inputs to an actual physical AND gate logic circuit, may simplify to a wire or connection when those logic truth table states are specified as "don't care" states, where for example the don't care states may be either logic "0" or logic "1" or their corresponding signal voltage values. Thus, in the proposed approach, don't-cares were created based on the existing invalid output signal of codeword error checker and/or codeword types.

FIG. 16 is an exemplary logic truth table 1600. Left hand column 1602 identifies input of truth table (10-bit codes "Code [9:0]") while the right hand column identifies the output functions to be synthesized. Targeted output functions are a DC value of codeword 1608, an invalid Codeword (invalCW) 1610, and an RD type (RDT) function 1612 of a codeword $c_i$. Recall from the description elsewhere herein that $RDT(c_i) \in \{-1,0,1\}$ and $DC(c_i) \in \{-2, 0, 2\}$. The symbol "X" in the table identifies a don't-care condition. In some exemplary embodiments, eleven logical equations that detect invalid codeword may be used to implement the required invalid codeword (invalCW) function. Other embodiments may also use different logical or mathematical equations or different numbers of equations to implement the required invalid codeword (invalCW) function.

When a codeword is invalid (invalCW) this condition may be identified by the invalCW output function which is implemented using the set of equations described elsewhere herein. The equations for invalCW may be implemented in simple logic that does not consume a large semiconductor area. Utilization of existing invalCW output function and of codeword type embedded in the RDT function can significantly reduce the number of required or specified inputs and increase the same number of output don't-cares in the truth table for the DC and the RDT output functions. In some embodiments, a reduction of logic and corresponding circuit area obtained by utilizing increased number of don't-cares may be at least 50% as compared to logic circuits not utilizing the don't care optimization of the present invention. In other embodiments, the reduction of logic circuits and area may be at least 60%, in others at least 70%, while in others at least 80%, or even more. This will be more readily appreciated in light of the specific example now described.

Recall the exemplary unused invalid codewords in the IBM 8B/10B encoding which have valid DC values are the codewords 4160, 5051, and 4061, where the codeword "M1N0" or "N0M1" denotes the 10-bit codeword composed of M number of 1s and N number of 0s. Since a codeword of $RD_{-2}$ and $RD_2$ types may be identified with the DC values only as indicated in rows 1621 and 1625 and, the RDT can be don't-cares for all 4160 and 4061 codewords. The RD types that can inferred from the DC values can introduce total number of 234 (2 times 117) don't-cares. The use of the don't-care strategy results in the elimination of 117 specified inputs, as the number indicated by the parenthetic "(117)", of RDT output function in rows 1621 and 1626 of column 1606.

The DC values and RD types may not need to be considered for the invalid codewords because they can be detected by the codeword error checker that implements the invalCW output function. Hence, the output of DC and of RDT can be don't-cared for the rows 1624, 1627 and 1628, introducing 44, 186 and 356 number of don't-cares, respectively.

As a result of the inventive proposed don't-care strategy applied to the C3 circuits, a 816 (117+44+117+186+352) number of output don't-cares and 582 (44+186+352) from a total of 1024 for the RDT and the DC output functions, respectively. This proposed strategy has therefore reduced the number of specified inputs by 816/1024=0.7968 or nearly 80% for the RDT function and nearly 57% for DC output function. It will be appreciated that these are the numbers for a particular exemplary design, and that somewhat different numbers of total don't-cares may represent the total for that alternative design. In any event the reduction of resulting logic and the corresponding semiconductor area in a semiconductor implementation may be significant.

As used herein, the term "embodiment" means an embodiment that serves to illustrate by way of example but not limitation.

It will be appreciated to those skilled in the art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

We claim:

1. A high-speed input/output (HSIO) receiver comprising:
a deserializer configured for deserializing incoming serialized encoded data into an encoded data packet;
a code book configured to determine whether the encoded data packet is invalid, the code book including all valid code words of an encoding scheme and at least some invalid code words of the encoding scheme so long as the invalid code words satisfy at least one integrated circuit (IC) production test specification for performing a built-in self-test of an integrated circuit under test;

specification logic configured to check if the encoded data packet is valid or invalid, an invalid data packet violating the specifications of the code book; and data packet error logic for registering a transmission error, in operation, if the encoded data packet is invalid.

2. The high-speed input/output (HSIO) receiver as in claim 1, wherein the receiver further comprises:

a concurrent code checker, and wherein the code book and the at least one integrated circuit (IC) production test specification are configured within the concurrent code checker.

3. The high-speed input/output (HSIO) receiver as in claim 2, wherein the at least one integrated circuit (IC) production test specification includes a DC integrated circuit (IC) production test specification and an RD integrated circuit (IC) production test specification.

4. The high-speed input/output (HSIO) receiver as in claim 3, wherein both the encoded data packets are checked individually for validity or invalidity and the data stream including multiple data packets is checked for validity or invalidity while still encoded using logical equations in the code book and the at least one integrated circuit (IC) production test specification including using a DC-balanced encoding scheme that DC-balances a data stream of code words and using a running disparity (RD) tracking of code words that tracks if a surplus of 0's or 1's have been received.

5. The high-speed input/output (HSIO) receiver as in claim 2, wherein the at least one test specification includes both a DC integrated circuit (IC) production test specification and an RD integrated circuit (IC) production test specification, and the DC and RD integrated circuit (IC) production test specifications are implemented as a finite-state-machine (FSM).

6. The high-speed input/output (HSIO) receiver as in claim 5, wherein the check for validity or invalidity is performed while the encoded data packets are still encoded using logical equations in the code book and the DC integrated circuit (IC) production test and the RD integrated circuit (IC) production test specifications.

7. The high-speed input/output (HSIO) receiver as in claim 2, wherein the code book is implemented to include at least one of a combinational logic circuit and a read-only memory (ROM).

8. The high-speed input/output (HSIO) receiver as in claim 2, wherein the at least one test specification is implemented using a finite-state-machine (FSM).

9. The high-speed input/output (HSIO) receiver as in claim 2, wherein the at least one test specification includes at least one of:

(i) a DC specification, and the receiver further comprising a DC logic unit which verifies the DC specification of a codeword and the DC specification of a data stream; and (ii) an RD specification, and the receiver further comprising a RD logic unit which verifies the RD specification of a codeword and the RD specification of a data stream.

10. The high-speed input/output (HSIO) receiver as in claim 9, further comprising a bit-error-rate counter, wherein the bit-error-rate counter is incremented if the data packet is invalid.

11. The high-speed input/output (HSIO) receiver as in claim 9, further comprising: a multiple input signature register (MISR), wherein, in operation, the MISR registers an error if the data packet is invalid.

12. The high-speed input/output (HSIO) receiver as in claim 2, further comprising a test clock control structure for halting a clock in order to examine internal registers if the data packet is invalid.

13. The high-speed input/output (HSIO) receiver as in claim 2, wherein the concurrent code checker includes a finite-state-machine (FSM) with four states, wherein, in operation, the FSM tracks a data stream of which the data packet is part.

14. The high-speed input/output (HSIO) receiver as in claim 13, wherein the FSM self synchronizes by extracting a starting point from the data stream.

15. The high-speed input/output (HSIO) receiver as in claim 13, further comprising a test clock control structure for halting a clock in order to examine internal registers if the data packet is invalid.

16. The high-speed input/output (HSIO) receiver as in claim 13, wherein, in operation, the FSM is configured to recover from errors so that continuous measurement of bit-error-rate (BER) can be carried out without interruption.

17. The high-speed input/output (HSIO) receiver as in claim 2, wherein, in operation, the MISR is independent of an employed encoding scheme.

18. The high-speed input/output (HSIO) receiver as in claim 2, wherein the concurrent code checker includes a plurality of finite-state-machines (FSM), wherein, in operation, a first FSM tracks the DC balance of a data stream including the encoded data packet and a second FSM tracks the running disparity (RD) value of the data stream.

19. The high-speed input/output (HSIO) receiver as in claim 2, wherein the code book is implemented using read-only memory, wherein, in operation, allowing configurable testing by allowing customizable RD values to encoded data packets.

20. The high-speed input/output (HSIO) receiver as in claim 2, wherein: the concurrent code checker further includes:

a concurrent code checker logic configured to determine the DC value of a encoded data packet in a data stream; and a finite state machine (FSM) configured to track the state of the data stream;

wherein, in operation, the concurrent code checker logic sends the DC value of the encoded data packet to the FSM which uses the DC value to determine if an error has occurred given the current state of the data stream.

21. The high-speed input/output (HSIO) receiver as in claim 2, wherein the deserializer, the concurrent code checker, and the decoder of the receiver are implemented on the same chip as a device to test to provide a built-in test capability for a device under test.

22. The high-speed input/output (HSIO) receiver as in claim 2, further comprising data packet error logic for registering a transmission error, in operation, if the encoded data packet is invalid.

23. The high-speed input/output (HSIO) receiver in claim 2, wherein the receiver further comprises a finite state machine (FSM);

the code checker determines a DC value of an encoded data packet in a data stream;

and the finite state machine (FSM) is configured to track the state of the data stream; and the code checker includes means for sending the DC value of the encoded data packet to the FSM which uses the DC value to determine if an error has occurred given the current state of the data stream.

24. The high-speed input/output (HSIO) receiver in claim 2, wherein the code checker is implemented independent of a PRBS polynomial that can generate only a single pseudo-random pattern sequence, and wherein the code checker can check many pseudo-random pattern sequence.

25. The high-speed input/output (HSIO) receiver in claim 2, wherein the code checker is configured to operate in an online system mode, in an offline integrated circuit (IC) production test mode, and in a debugging mode, in response to control signals.

26. The high-speed input/output (HSIO) receiver in claim 2, wherein the code book is implemented by synthesizing the valid code words into logical equations which are applied to encoded data packets to check the data packet for invalidity.

27. The high-speed input/output (HSIO) receiver in claim 2, further including a test clock control structure (TCCS) used for halting a control clock and allowing debugging to occur and coupled to the code checker;
the TCCS operable for halting the control clock regulating a data bus on the receiver circuitry and for regulating the transmission of the data stream and allowing debugging to occur; and
the code checker being configured to halt operation of the receiver when an error occurs to allowing error debugging to proceed by examining internal values of registers.

28. The high-speed input/output (HSIO) receiver in claim 2, wherein the receiver includes multiple code checkers and is configured to receive and observe outputs of the multiple code checkers simultaneously and to capture a large number of errors should they occur without overflow.

29. The high-speed input/output (HSIO) receiver in claim 28, wherein the code delimeter detector is configured to use a special control character and the valid signal from code checker to synchronize a valid codeword boundary; and
the RD FSM is enabled when a codeword boundary is detected, and checks for correct sequence of DC/RD.

30. The high-speed input/output (HSIO) receiver in claim 29, wherein the RD FSM is a self-synchronizing FSM.

31. The high-speed input/output (HSIO) receiver in claim 2, wherein the code checker further includes:
a code delimiter detector;
a code checker logic;
a running disparity finite state machine (RD FSM);
a MISR counter;
a clock halting circuit; and
the code checker produces a DC and/or RD value for a codeword passed to the DC/RD FSM.

32. The high-speed input/output (HSIO) receiver as in claim 2, wherein the receiver including the concurrent code checker is configured to operate without a Pseudo-Random Binary Sequence (PRBS) generator and test patterns are not limited to test patterns that can be generated by a Linear-Feedback Shift Register (LFSR) polynomial.

33. A high-speed input/output (HSIO) receiver comprising:
means for deserializing incoming serialized encoded data into an encoded data packet;
code book means for determining whether the encoded data packet is invalid, the code book means including all valid code words of an encoding scheme and at least some invalid code words of the encoding scheme so long as the invalid code words satisfy at least one integrated circuit (IC) production test specification for performing a built-in self-test of an integrated circuit under test;
specification logic means for checking if the encoded data packet is valid or invalid, an invalid data packet violating the specifications of the code book; and
registration means for registering a data packet transmission error, in operation, if the encoded data packet is invalid.

34. A method for operating a high-speed input/output (HSIO) receiver comprising:
deserializing incoming serialized encoded data into an encoded data packet;
determining using a code book whether the encoded data packet is invalid, the code book means including all valid code words of an encoding scheme and at least some invalid code words of the encoding scheme so long as the invalid code words satisfy at least one integrated circuit (IC) production test specification for performing a built-in self-test of an integrated circuit under test;
checking if the encoded data packet is valid or invalid, an invalid data packet violating an integrated circuit (IC) production logic test specification of the code book; and
registering a data packet transmission error, in operation, if the encoded data packet is invalid.

35. The method as in claim 34, wherein the method further comprises:
operating a concurrent code checker using the code book and the at least one integrated circuit (IC) production test specification within the concurrent code checker.

36. The method in claim 35, wherein, in operation, the specification logic checks the data packet for invalidity using static properties of the data packet and dynamic properties of a stream of data including the data packet.

37. The method in claim 35, wherein the data packet is a 10-bit codeword encoded using a DC-balanced clock-embedded encoding scheme.

38. The method in claim 35, wherein the code book comprises a plurality of values adapted for use in determining whether the 10-bit codeword is compliant with the encoding scheme used in encoding the data packet.

39. The method in claim 35, wherein the specification logic comprises eleven logical equations adapted for use in determining whether the 10-bit codeword is invalid.

40. The method in claim 35, wherein the incoming data is a stream of 10-bit code words and wherein, in operation, the specification logic determines whether the number of 1's and 0's is balanced in the stream of 10-bit code words.

41. The method in claim 35, wherein the incoming data is a stream of 10-bit code words and wherein, in operation, the specification logic determines whether the running disparity (RD) of the stream of 10-bit code words violates the encoding scheme.

42. The method in claim 41, wherein the specification logic comprises eleven logical equations configured for use in determining whether the 10-bit codeword is invalid.

43. The method in claim 35, further comprising incrementing a bit-error-rate counter if the data packet is invalid.

44. The method in claim 35, further comprising registering an error in a multiple input signature register (MISR) if the data packet is invalid.

45. The method in claim 35, further comprising halting a clock in order to examine internal registers if the data packet is invalid.

46. A The method in claim 35, wherein the specification logic includes a finite-state-machine (FSM) with four states, wherein, in operation, the FSM tracks a data stream which the data packet is part.

47. The method in claim 46, further comprising self-synchronizing the FSM by extracting the starting point from the data stream.

48. A The method in claim 46, wherein, in operation, the FSM recovering from errors so that continuous measurement of bit-error-rate (BER) can be carried out without interruption.

49. The method in claim 35, further comprising self synchronizing a multiple input signature register (MISR).

50. The method in claim 49, wherein, in operation, the MISR is independent of employed encoding scheme.

51. The method in claim 35, wherein the specification logic includes a plurality of finite-state-machines (FSM), wherein, in operation, (i) tracking with a first FSM, the DC balance of a data stream including the encoded data packet; and (ii) tracking with a second FSM the running disparity (RD) value of the data stream.

52. The method in claim 35, further comprising: implementing the code book using read-only memory, wherein, in operation, allowing configurable testing by allowing customizable RD values to encoded data packets.

53. The method in claim 35, wherein: the checking, using specification logic, includes,
 detecting errors with an error detection circuitry including;
  determining, using a concurrent code checker (C3) logic, the DC value of a encoded data packet in a data stream; and
  tracking, in a finite state machine (FSM), the state of the data stream;
  wherein, in operation, the C3 logic sending the DC value of the encoded data packet to the FSM which uses the DC value for determining if an error has occurred given the current state of the data stream.

54. The method in claim 35, further comprising:
 programming at least one register in the concurrent code checker (C3) logic to configure the system into a testing mode;
 monitoring code words and determining a number of valid code words detected;
 if a predetermined number of valid code words are detected, a test control circuitry in a code delimiter detector (CDD) enabling a running disparity finite state machine (RD FSM) to check validity of a data stream;
 when the RD FSM is enabled, using the RE FSM to monitor the data stream and to properly synchronize to the data stream;
 after synchronization, the C3 continuously tracking the test specification until done; and
 when testing is completed, disabling the C3 logic.

55. The method as in claim 54, wherein the configuring of the system into a testing mode comprises configuring the system into an online testing mode, and the online testing mode further comprises:
 enabling a valid codeword (valCW) in the code delimiter detector (CDD) to synchronize beginning of a data stream; and
 configuring code error checker control signal (CEC_en) for enabling a CEC and a DC/RD control signals (DC or RD spec check) for selecting a test specification from available test specifications.

56. A non-transient computer readable media comprising a computer program stored therein including instructions for controlling the operation of a high-speed input/output (HSIO) receiver including a computing device having a processing logic, the instructions including instructions for performing the steps of a method for receiving comprising:
 deserializing incoming serialized encoded data into an encoded data packet;
 determining using a code book whether the encoded data packet is invalid, the code book means including all valid code words of an encoding scheme and at least some invalid code words of the encoding scheme so long as the invalid code words satisfy at least one integrated circuit (IC) production test specification for performing a built-in self-test of an integrated circuit under test;
 checking if the encoded data packet is valid or invalid, an invalid data packet violating an integrated circuit (IC) production logic test specification of the code book; and
 registering a data packet transmission error, in operation, if the encoded data packet is invalid.

* * * * *